United States Patent
Nash et al.

(10) Patent No.: US 9,948,920 B2
(45) Date of Patent: *Apr. 17, 2018

(54) SYSTEMS AND METHODS FOR ERROR CORRECTION IN STRUCTURED LIGHT

(71) Applicant: QUALCOMM Incorporated, San Diego, CA (US)

(72) Inventors: James Wilson Nash, San Diego, CA (US); Kalin Mitkov Atanassov, San Diego, CA (US); Sergiu Radu Goma, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 139 days.

This patent is subject to a terminal disclaimer.

(21) Appl. No.: 14/820,419

(22) Filed: Aug. 6, 2015

(65) Prior Publication Data

US 2016/0255332 A1 Sep. 1, 2016

Related U.S. Application Data

(60) Provisional application No. 62/126,379, filed on Feb. 27, 2015.

(51) Int. Cl.
*H03M 13/00* (2006.01)
*H04N 13/00* (2018.01)
(Continued)

(52) U.S. Cl.
CPC ......... *H04N 13/0271* (2013.01); *G01B 11/25* (2013.01); *G06F 11/10* (2013.01);
(Continued)

(58) Field of Classification Search
CPC ........... H04N 13/0022; H04N 13/0048; H04N 13/0081; H04N 13/0253; H04N 13/0271;
(Continued)

(56) References Cited

U.S. PATENT DOCUMENTS 4,653,104 A 3/1987 Tamura
6,229,913 B1 5/2001 Nayar et al.
(Continued)

FOREIGN PATENT DOCUMENTS

CN 102831582 A 12/2012
CN 103796004 A 5/2014
(Continued)

OTHER PUBLICATIONS

International Search Report and Written Opinion—PCT/US2016/017491—ISA/EPO—dated Jun. 10, 2016.
(Continued)

*Primary Examiner* — Albert Decady
*Assistant Examiner* — Christian Dorman
(74) *Attorney, Agent, or Firm* — Knobbe, Martens, Olson & Bear, LLP

(57) ABSTRACT

Systems and methods for error correction in structured light are disclosed. In one aspect, a method includes receiving, via a receiver sensor, a structured light image of at least a portion of a composite code mask encoding a plurality of codewords, the image including an invalid codeword. The method further includes detecting the invalid codeword. The method further includes generating a plurality of candidate codewords based on the invalid codeword. The method further includes selecting one of the plurality of candidate codewords to replace the invalid codeword. The method further includes generating a depth map for an image of the scene based on the selected candidate codeword. The method further includes generating a digital representation of a scene based on the depth map. The method further includes outputting the digital representation of the scene to an output device.

23 Claims, 15 Drawing Sheets

(51) Int. Cl.
*H04N 13/02* (2006.01)
*G06F 11/10* (2006.01)
*H04L 1/00* (2006.01)
*G01B 11/25* (2006.01)
*H03M 13/39* (2006.01)
*H03M 13/47* (2006.01)
*G06F 11/07* (2006.01)

(52) U.S. Cl.
CPC ....... *H04L 1/0045* (2013.01); *H04N 13/0253* (2013.01); *H04N 13/0296* (2013.01); *G06F 11/07* (2013.01); *G06F 11/0703* (2013.01); *G06F 11/0751* (2013.01); *G06F 11/0793* (2013.01); *H03M 13/39* (2013.01); *H03M 13/47* (2013.01); *H03M 13/61* (2013.01); *H03M 13/615* (2013.01); *H04N 13/0022* (2013.01); *H04N 13/0048* (2013.01)

(58) Field of Classification Search
CPC ..... H04N 13/0296; G01B 11/25; G06F 11/07; G06F 11/0703; G06F 11/0751; G06F 11/0793; G06F 11/10; H04L 1/0045; H03M 13/39; H03M 13/47; H03M 13/61; H03M 13/615
See application file for complete search history.

(56) References Cited

U.S. PATENT DOCUMENTS

| | | | |
|---|---|---|---|
| 7,212,663 | B2 | 5/2007 | Tomasi |
| 7,440,590 | B1 | 10/2008 | Hassebrook et al. |
| 7,894,525 | B2 | 2/2011 | Piehl et al. |
| 7,916,932 | B2 | 3/2011 | Lee et al. |
| 8,531,535 | B2 | 9/2013 | Kwatra et al. |
| 8,724,854 | B2 | 5/2014 | Jin et al. |
| 8,806,305 | B2 | 8/2014 | Przybylski |
| 9,530,215 | B2 | 12/2016 | Siddiqui et al. |
| 9,638,801 | B2 | 5/2017 | Boufounos et al. |
| 2004/0151365 | A1 | 8/2004 | An et al. |
| 2005/0018209 | A1 | 1/2005 | Lemelin et al. |
| 2005/0229069 | A1 | 10/2005 | Hassner et al. |
| 2006/0210145 | A1* | 9/2006 | Lee ................. G01B 11/2513 382/154 |
| 2008/0130016 | A1 | 6/2008 | Steinbichler et al. |
| 2008/0205748 | A1 | 8/2008 | Lee et al. |
| 2009/0022367 | A1 | 1/2009 | Sasaki |
| 2009/0310822 | A1 | 12/2009 | Chang et al. |
| 2009/0322859 | A1 | 12/2009 | Shelton et al. |
| 2010/0074532 | A1 | 3/2010 | Gordon et al. |
| 2010/0180176 | A1 | 7/2010 | Yosoku et al. |
| 2011/0096832 | A1 | 4/2011 | Zhang et al. |
| 2011/0147620 | A1 | 6/2011 | Arai et al. |
| 2012/0019836 | A1 | 1/2012 | Honma et al. |
| 2012/0056874 | A1 | 3/2012 | Kim et al. |
| 2012/0056982 | A1 | 3/2012 | Katz et al. |
| 2012/0086803 | A1* | 4/2012 | Malzbender ........ G01B 11/026 348/140 |
| 2012/0229609 | A1 | 9/2012 | Yamada et al. |
| 2012/0242795 | A1 | 9/2012 | Kane et al. |
| 2012/0294510 | A1 | 11/2012 | Zhang et al. |
| 2013/0038694 | A1 | 2/2013 | Nichani et al. |
| 2013/0050426 | A1 | 2/2013 | Sarmast et al. |
| 2013/0128121 | A1 | 5/2013 | Agarwala et al. |
| 2013/0141544 | A1 | 6/2013 | Tsuyuki |
| 2013/0162629 | A1 | 6/2013 | Huang et al. |
| 2013/0293684 | A1 | 11/2013 | Becker et al. |
| 2013/0301908 | A1* | 11/2013 | Shim ................ G06T 5/005 382/154 |
| 2013/0314696 | A1* | 11/2013 | Atanassov ............ G06T 5/001 356/51 |
| 2013/0315354 | A1 | 11/2013 | Atanassov et al. |
| 2013/0315501 | A1 | 11/2013 | Atanassov et al. |
| 2013/0342671 | A1 | 12/2013 | Hummel et al. |
| 2014/0002610 | A1 | 1/2014 | Xi et al. |
| 2014/0118539 | A1 | 5/2014 | Ota et al. |
| 2014/0132721 | A1 | 5/2014 | Martinez et al. |
| 2014/0132722 | A1 | 5/2014 | Martinez et al. |
| 2014/0160309 | A1 | 6/2014 | Karpenko |
| 2014/0168362 | A1 | 6/2014 | Hannuksela et al. |
| 2014/0192154 | A1 | 7/2014 | Jeong et al. |
| 2014/0219549 | A1 | 8/2014 | Choi et al. |
| 2014/0223256 | A1 | 8/2014 | Sakai et al. |
| 2014/0240318 | A1 | 8/2014 | Coombe et al. |
| 2014/0241614 | A1 | 8/2014 | Lee |
| 2014/0380115 | A1 | 12/2014 | Bar-On |
| 2015/0110347 | A1 | 4/2015 | Suzuki |
| 2015/0117514 | A1 | 4/2015 | Choi et al. |
| 2015/0178592 | A1 | 6/2015 | Ratcliff et al. |
| 2015/0193938 | A1 | 7/2015 | Freedman et al. |
| 2015/0229911 | A1 | 8/2015 | Ge et al. |
| 2015/0310620 | A1 | 10/2015 | Aviv et al. |
| 2015/0381972 | A1 | 12/2015 | Kowdle et al. |
| 2016/0050372 | A1 | 2/2016 | Lindner et al. |
| 2016/0202050 | A1 | 7/2016 | Lee et al. |
| 2016/0267671 | A1 | 9/2016 | Atanassov |
| 2017/0048507 | A1 | 2/2017 | Campbell et al. |
| 2017/0061634 | A1 | 3/2017 | Nash et al. |

FOREIGN PATENT DOCUMENTS

| | | |
|---|---|---|
| JP | 2012141252 A | 7/2012 |
| KR | 20140088309 A | 7/2014 |
| WO | WO-9210830 A1 | 6/1992 |
| WO | WO-200181859 A1 | 11/2001 |
| WO | WO-2013068548 A2 | 5/2013 |
| WO | WO-2013074510 A1 | 5/2013 |
| WO | WO-2015152829 A1 | 10/2015 |
| WO | WO-2016137753 | 9/2016 |

OTHER PUBLICATIONS

Zhang J., et al., "Robust Human Tracking Algorithm Applied for Occlusion Handling", Frontier of Computer Science and Technology (FCST), 2010 Fifth International Conference on, IEEE, Piscataway, NJ, USA, Aug. 18, 2010 (Aug. 18, 2010), pp. 546-551, XP031755281, ISBN: 978-1-4244-7779-1.

Buyukyazi T., et al., "Real-time Image Stabilization and Mosaicking by Using Ground Station CPU in UAV surveillance", 2013 6th International Conference on Recent Advances in Space Technologies (RAST), IEEE, Jun. 12, 2013 (Jun. 12, 2013), pp. 121-126, XP032477136, DOI : 10. 1109/RAST .2013.6581183 ISBN : 978-1-4673-6395 -2.

Hong W., et al., "Video Stabilization and Rolling Shutter Distortion Reduction", 2010 17th IEEE International Conference on Image Processing (ICIP 2010), Sep. 26-29, 2010, Hong Kong, China, IEEE, Piscataway, NJ, USA, Sep. 26, 2010 (Sep. 26, 2010), pp. 3501-3504, XP031811299, ISBN: 978-1-4244-7992-4.

Lindner A., et al., "Depth Enhanced and Content Aware Video Stabilization", Proceedings of SPIE, vol. 9411, Mar. 11, 2015 (Mar. 11, 2015), pp. 941106-1 to 941106-6, XP055229514, US ISSN: 0277-786X, DOI: 10.1117/12.2083443 ISBN: 978-1-62841-839-2.

Yahyanejad S., et al., "Incremental, Orthorectified and Loop-independent Mosaicking of Aerial Images taken by Micro UAVs", Robotic and Sensors Environments (ROSE), 2011 IEEE International Symposium on, IEEE, Sep. 17, 2011 (Sep. 17, 2011), pp. 137-142, XP031961274, DOI: 10.1109/ROSE.2011.6058531 ISBN: 978-1-4577-0819-0.

Tsalakanidou et al., "Real-time Acquisition of Depth and Color Images using Structured Light and its Application to 3D Face Recognition", Real-Time Imaging, Academic Press Limited, GB, vol. 11, No. 5-6, Oct. 1, 2005 (Oct. 1, 2005), pp. 358-369, XP005074682, ISSN: 10772014, DOI: 10.1016/J.RTI.2005.06.006.

Wijenayake U., et al., "An Error Correcting 3D Scanning Technique Using Dual Pseudorandom Arrays," 3D Imaging, Modeling, Processing, Visualization and Transmission (3DIMPVT), 2012 Second International Conference on, IEEE, Oct. 13, 2012 (Oct. 13, 2012), pp. 517-523, XP032277316, DOI: 10.1109/3DIMPVT.2012.68 ISBN: 978-1-4673-4470-8.

(56) References Cited

OTHER PUBLICATIONS

Wijenayake U., et al., "Dual Pseudorandom Array Technique for Error Correction and Hole Filling of Color Structured-light three-dimensional Scanning," Optical Engineering., vol. 54(4), Apr. 27, 2015 (Apr. 27, 2015), p. 043109, XP055309719, Bellingham ISSN: 0091-3286, DOI: 10.1117/1.0E.54.4.043109.

* cited by examiner

SYSTEMS AND METHODS FOR ERROR CORRECTION IN STRUCTURED LIGHT

CROSS REFERENCE TO RELATED APPLICATIONS

This application claims priority to U.S. Provisional Patent Application No. 62/126,379, entitled "SYSTEMS AND METHODS FOR ERROR CORRECTION IN STRUCTURED LIGHT," filed on Feb. 27, 2015, which is hereby incorporated by reference in its entirety.

FIELD

Various features pertain to active depth sensing and more specifically to techniques to correct gaps in depth maps resulting from data errors when interpreting depth information derived from structured light.

BACKGROUND

Structured light active sensing systems transmit and receive patterns corresponding to spatial codes (codewords), to generate a depth map for a scene. The farther away an object is from the transmitter and receiver, the closer the received spatial code projection is from its original position at the receiver(s), as the outgoing spatial code projection and reflected incoming spatial code projection are more parallel. Conversely, the closer an object is to the transmitter and receiver, the farther the received spatial code projection is from its original position at the receiver(s). Thus, the difference between a received and a transmitted codeword position indicates the depth of an object in the scene. Structured light active sensing systems use these relative depths to generate a depth map, or a three dimensional representation of a scene. Depth maps are critical to many applications ranging from camera quality enhancement to computer vision.

Each codeword may be encoded using light patterns segmented into rows and columns with varying intensity values. For example, bright and dark intensity values may be used to represent 0's and 1's to form a binary pattern. Other spatial codes may use more than two different intensity values.

Interference, such as speckle may cause the received spatial codes and resultant depth maps to have gaps or holes. For example, interference present when a binary code is transmitted may cause an encoded "1" value in the transmitted code to be received as a "0", or vice versa. Thus, the received spatial code won't be recognized as the spatial code that was transmitted. This resulting error may result in incorrect or missing depth values in a depth map of the scene.

SUMMARY

Methods and apparatuses or devices being disclosed herein each have several aspects, no single one of which is solely responsible for its desirable attributes. Without limiting the scope of this disclosure, for example, as expressed by the claims which follow, its more prominent features will now be discussed briefly. After considering this discussion, and particularly after reading the section entitled "Detailed Description" one will understand how the features being described provide advantages that include error correction in structured light.

One aspect disclosed is a method of error correction in structured light. In various embodiments, the method may include receiving, via a receiver sensor, a structured light image of at least a portion of a composite code mask encoding a plurality of codewords, the image including an invalid codeword. The method may further include detecting the invalid codeword. The method may further include generating a plurality of candidate codewords based on the invalid codeword. The method may further include selecting one of the plurality of candidate codewords to replace the invalid codeword. The method may further include generating a depth map for an image of the scene based on the selected candidate codeword. The method may further include generating a digital representation of a scene based on the depth map. The method may further include outputting the digital representation of the scene to an output device.

For some implementations, detecting the invalid codeword includes determining whether the received codeword is included in the plurality of encoded codewords and determining the received codeword is invalid in response to a determination that the received codeword is not included in the plurality of encoded words.

For some implementations, the encoded codewords are formed of combinations of a plurality of basis functions and rotated versions of the plurality of basis functions. For some implementations, detecting the invalid codeword includes comparing the received codeword to each of the plurality of basis functions and rotated versions of the plurality of basis functions. For some implementations, the comparing includes match filtering the received codeword to each of the plurality of basis functions and rotated versions of the plurality of basis functions.

For some implementations, generating the plurality of candidate codewords includes individually perturbing each element of the invalid codeword to generate a candidate codeword for each individual perturbation. For some implementations, generating the plurality of candidate codewords comprises iteratively perturbing at least two elements of the invalid codeword to generate a candidate codeword for each iteration until all combinations of at least two elements have been perturbed once.

For some implementations, selecting one of the plurality of candidate codewords to replace the invalid codeword includes selecting a subset of the plurality of candidate codewords that are included in the plurality of encoded codewords. For some implementations, selecting one of the plurality of candidate codewords to replace the invalid codeword further includes determining a similarity between each of the selected subset of candidate codewords and a local neighborhood of codewords around the invalid codeword. For some implementations, selecting one of the plurality of candidate codewords to replace the invalid codeword further includes selecting the candidate codeword most similar to the local neighborhood to replace the invalid codeword. For some implementations, the similarity corresponds to a difference in depth associated with each of the selected subset of candidate codewords and a depth associated with the local neighborhood of codewords around the invalid codeword. For some implementations, the local neighborhood of codewords of the invalid codeword consists of codewords within 1, 2, 3, 4, 5, or 6 codeword locations of the location of the invalid codeword. For some implementations, the depth associated with the local neighborhood is a median depth.

Another aspect disclosed is an apparatus for error correction in structured light. The error correction apparatus may include a receiver sensor configured to receive a structured light image of at least a portion of a composite code mask encoding a plurality of codewords, the image including an invalid codeword. The error correction apparatus may further include a processing circuit in communication with the receiver sensor, the processing circuit. The processing circuit may be configured to detect the invalid codeword. The processing circuit may be further configured to generate a plurality of candidate codewords based on the invalid codeword. The processing circuit may be further configured to select one of the plurality of candidate codewords to replace the invalid codeword. The processing circuit may be further configured to generate a depth map for an image of the scene based on the selected candidate codeword. The processing circuit may be further configured to generate a digital representation of a scene based on the depth map. The processing circuit may be further configured to output the digital representation of the scene to an output device.

For some implementations, the processing circuit is further configured to determine whether the received codeword is included in the plurality of encoded codewords For some implementations, the processing circuit is configured to determine the received codeword is invalid in response to a determination that the received codeword is not included in the plurality of encoded words.

For some implementations, the encoded codewords are formed of combinations of a plurality of basis functions and rotated versions of the plurality of basis functions. For some implementations, the processing circuit is further configured to compare the received codeword to each of the plurality of basis functions and rotated versions of the plurality of basis functions. For some implementations, the processing circuit is further configured to match filter the received codeword to each of the plurality of basis functions and rotated versions of the plurality of basis functions.

For some implementations, the processing circuit is further configured to perturb each element of the invalid codeword and generate a candidate codeword for each individual perturbation. For some implementations, the processing circuit is further configured to iteratively perturb at least two elements of the invalid codeword to generate a candidate codeword for each iteration until all combinations of at least two elements have been perturbed once.

For some implementations, the processing circuit is further configured to select a subset of the plurality of candidate codewords that are included in the plurality of encoded codewords. For some implementations, the processing circuit is further configured to determine a similarity between each of the selected subset of candidate codewords and a local neighborhood of codewords around the invalid codeword. For some implementations, the processing circuit is further configured to select the candidate codeword most similar to the local neighborhood to replace the invalid codeword. For some implementations, the similarity corresponds to a difference in depth associated with each of the selected subset of candidate codewords and a depth associated with the local neighborhood of codewords around the invalid codeword. For some implementations, the local neighborhood of codewords around the invalid codeword consists of codewords within 1, 2, 3, 4, 5, or 6 codeword locations of the codeword location of the invalid codeword. For some implementations, the depth associated with the local neighborhood is a median depth.

Another aspect disclosed is an apparatus for error correction in structured light. The apparatus may include means for receiving a structured light image of at least a portion of a composite code mask encoding a plurality of codewords, the image including an invalid codeword. The apparatus may include means for detecting the invalid codeword. The apparatus may include means for generating a plurality of candidate codewords based on the invalid codeword. The apparatus may include means for selecting one of the plurality of candidate codewords to replace the invalid codeword. The apparatus may include means for generating a depth map for an image of the scene based on the selected candidate codeword. The apparatus may include means for generating a digital representation of a scene based on the depth map. The apparatus may include means for outputting the digital representation of the scene to an output device.

Another aspect disclosed is a non-transitory computer-readable medium storing instructions for error correction in structured light, the instructions when executed that, when executed, perform a method. The method may include receiving, via a receiver sensor, a structured light image of at least a portion of a composite code mask encoding a plurality of codewords, the image including an invalid codeword. The method may include detecting the invalid codeword. The method may include generating a plurality of candidate codewords based on the invalid codeword. The method may include selecting one of the plurality of candidate codewords to replace the invalid codeword. The method may include generating a depth map for an image of the scene based on the selected candidate codeword. The method may include generating a digital representation of a scene based on the depth map. The method may include outputting the digital representation of the scene to an output device.

BRIEF DESCRIPTION OF THE DRAWINGS

The above-mentioned aspects, as well as other features, aspects, and advantages of the present technology will now be described in connection with various implementations, with reference to the accompanying drawings. The illustrated implementations, however, are merely examples and are not intended to be limiting. Throughout the drawings, similar symbols typically identify similar components, unless context dictates otherwise. Note that the relative dimensions of the following figures may not be drawn to scale.

DETAILED DESCRIPTION OF CERTAIN EMBODIMENTS

Figure 1:
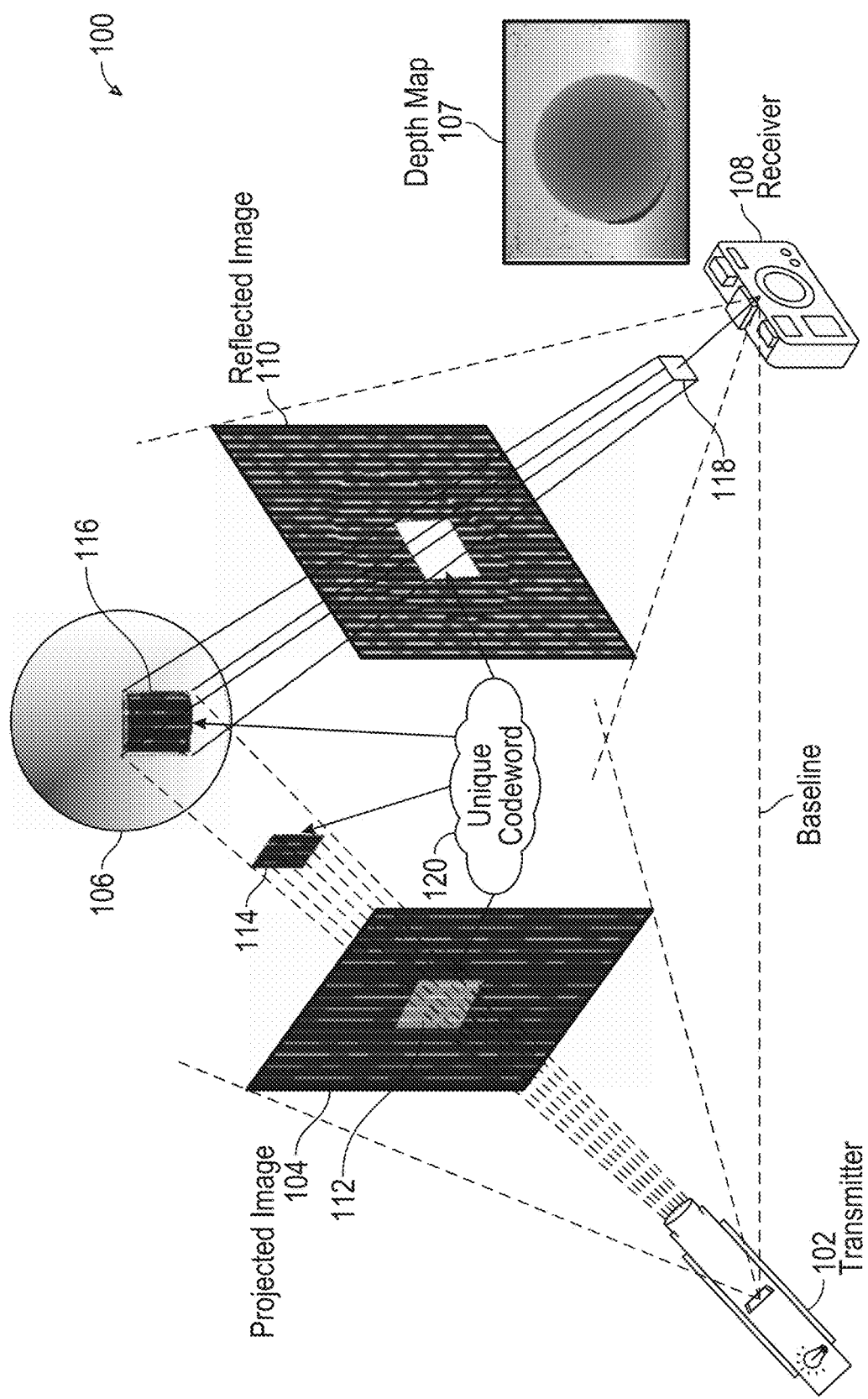
FIG. 1 is a schematic illustrating an example of an active sensing system where a known pattern is used to illuminate a scene or object and obtain depth information with which to generate 3-dimensional information from 2-dimensional images and/or information.

The following detailed description is directed to certain specific embodiments. However, the methods and systems disclosed can be embodied in a multitude of different ways. It should be apparent that the aspects herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Further, the systems and methods described herein may be implemented on a variety of different computing devices. These include mobile phones, tablets, dedicated cameras, wearable computers, personal computers, photo booths or kiosks, personal digital assistants, ultra-mobile personal computers, and mobile internet devices. They may use general purpose or special purpose computing system environments or configurations. Examples of computing systems, environments, and/or configurations that may be suitable for use with the invention include, but are not limited to, personal computers, server computers, hand-held or laptop devices, multiprocessor systems, microprocessor-based systems, programmable consumer electronics, network PCs, minicomputers, mainframe computers, distributed computing environments that include any of the above systems or devices, and the like.

As discussed above, structured light systems project a known pattern or code on a scene and process the received pattern or code to obtain a depth map. Each code word may be generated via the use of "basis functions" discussed in more detail below. The periodicities of the basis functions may be chosen to meet one or more requirements for the aggregate pattern of Hermitian symmetry (for eliminating ghost images and simplifying manufacturing), minimum duty cycle (to ensure a minimum power per codeword), perfect window property (for optimum contour resolution and code packing for high resolution), and randomized shifting (for improved detection on object boundaries).

If a received code matches one of the codes in a codebook listing valid codes, then the received code is most likely equivalent to the transmitted code, and thus, no error is present. Inevitably, due to speckle or other noise sources, certain regions of the received pattern may be altered between transmission and reception of the code. If the received code does not exactly match one of the codes in the codebook, then a receiver may determine the received code does not match the transmitted code and thus an error is present in the received code. Any un-decoded codewords create holes in the depth map which contain no depth information thus degrading the utility of the map.

Some solutions utilize matched filters to provide soft decisions on the presence of basis functions in a received codeword. Other mechanisms for error detection and correction involve the use of geometric constraints which do not use the underlying code structure and thus create no new information.

In some embodiments, the disclosed systems and methods may perform error correction by determining the most likely codeword that was transmitted based on the codebook containing a list of valid codes that may have been transmitted, and the codeword that was received.

For example, in some aspects, if a received code does not match any code in the codebook of valid codes, variations of the received code that include one or more bit differences from the received code bay be compared to the codebook to determine if any of the variations are included in the codebook of valid codes. If multiple variations of the received codewords are included in the codebook, a similarity measure between a local neighborhood of codewords and the candidate codewords is employed to select the variation most likely to match the original transmitted codeword.

Exemplary Operating Environment

FIG. 1 illustrates an exemplary active sensing system where a structured light pattern is used to illuminate a scene or object and obtain depth information. One or more aspects and/or features described herein may be implemented within such an exemplary active sensing system. FIG. 1 shows a transmitter 102 projecting a light through a code mask 104 (e.g., image with codes) to project codewords on an object or scene 106. A receiver 108 captures the projected code mask 110 and codewords therein. A section/portion/window 112 of the code mask 104 is projected (as section/portion/window 114) onto the surface (e.g., projected section/portion/window 116) of the object or scene 106. The projected section/portion/window 116 may then be captured by the receiver 108 as a captured segment 118. The section/portion/window 112 encodes a codeword that can be uniquely identified. By imaging the scene or object 106 with unique codewords in this manner, sections/portions of the scene or object 106 may be identified/tagged and this information may be used for depth sensing.

From the image captured by the receiver 108, multiple segments may be identified over the scene or object 106. Each segment 118 may be uniquely identifiable at the receiver 108 and its location relative to other segments ascertained from the known pattern of the coded mask 104. The identification of a code from each segment/portion/window may involve pattern segmentation (e.g., to address distortion) and decoding of the perceived segment/portion/window into a corresponding code(s). Additionally, triangulation may be applied over each captured segment/portion/window to ascertain an orientation and/or depth. Multiple such segments/portions/windows may be combined to stitch together a captured image pattern. In this manner, a map of depth may be generated for the scene or object 106.

Figure 2:
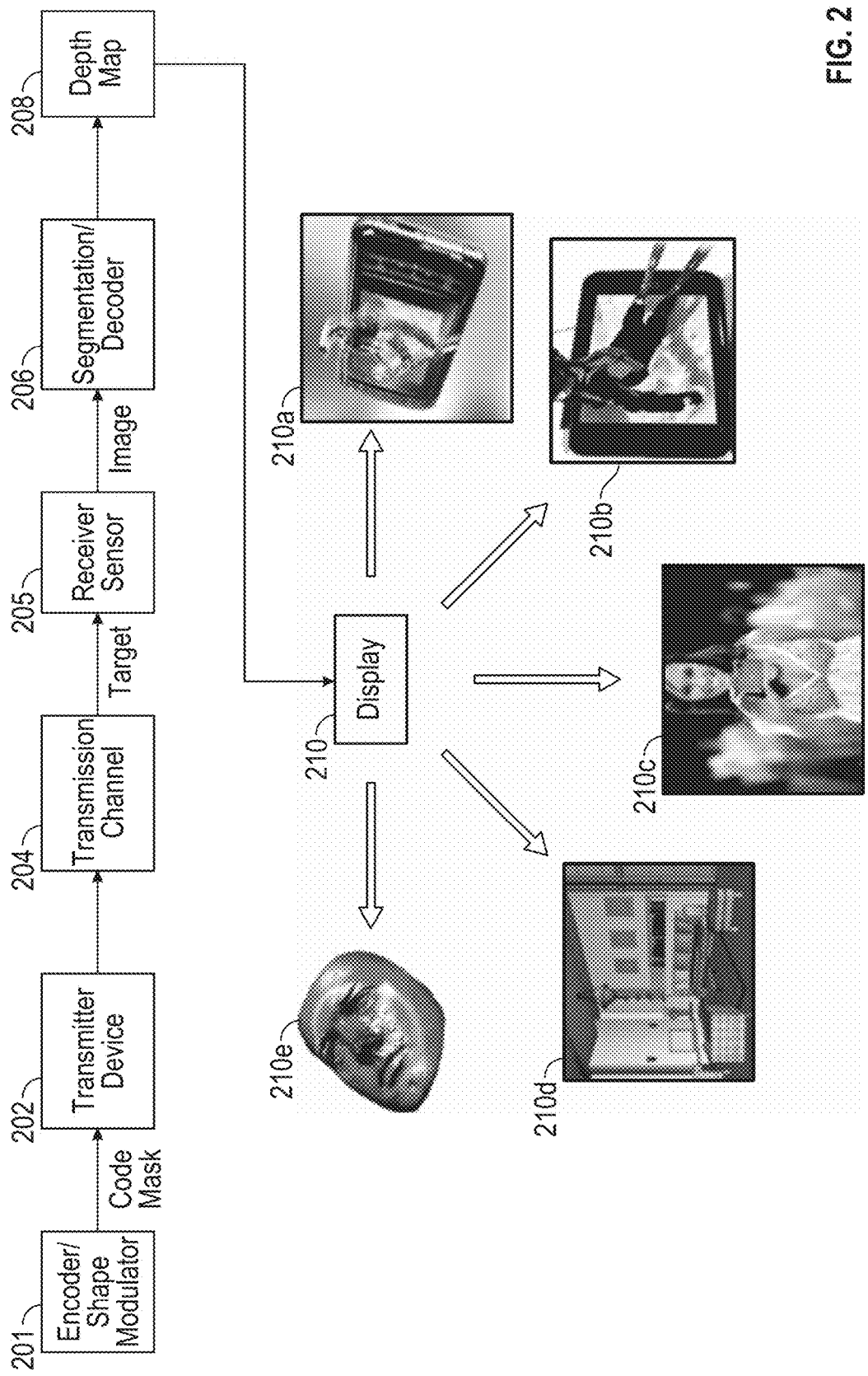
FIG. 2 is a diagram illustrating another example of a system for active sensing where a 3-dimensional (3D) scene is constructed from 2-dimensional (2D) images or information.

FIG. 2 illustrates another exemplary system for active sensing where a 3-dimensional (3D) scene is constructed from 2-dimensional (2D) images or information. An encoder/shape modulator 201 may serve to generate a code mask which is then projected by a transmitter device 202 over a transmission channel 204. The code mask may be projected onto a target (e.g., a scene or object) and the reflected light is captured by a receiver sensor 205 as an image (e.g., code mask image). At the receiver sensor 205 (e.g., receiver 108 in FIG. 1), the target (e.g., scene or object) is captured and its shape/depth is encoded 205. Shape/depth encoding may be achieved, for example, using the projected code mask to ascertain the depth information. For instance, the captured image of the scene or object (which includes the projected code mask) may be decoded 206 to obtain a depth map 208. The depth map 208 may then be used to present, generate, and/or provide a 3-dimensional version 210a-e of the target.

Active sensing relies on being able to recognize (at the receiver sensor 205 and/or decoder 206) all spatial codes (i.e., codewords) from the code mask being projected by the transmitter device 202 on a scene or object. If a scene or object is too close to transmitter/receiver, the surface of the scene or object is angled/curved, and/or a baseline reference plane is tilted, the codes become modified under unknown affine transformation (e.g., rotation, skew, compression, elongation, etc.).

One or more aspects or features described herein may be implemented within the exemplary environments of FIGS. 1 and 2.

Exemplary Active Depth Sensing

Figure 3:
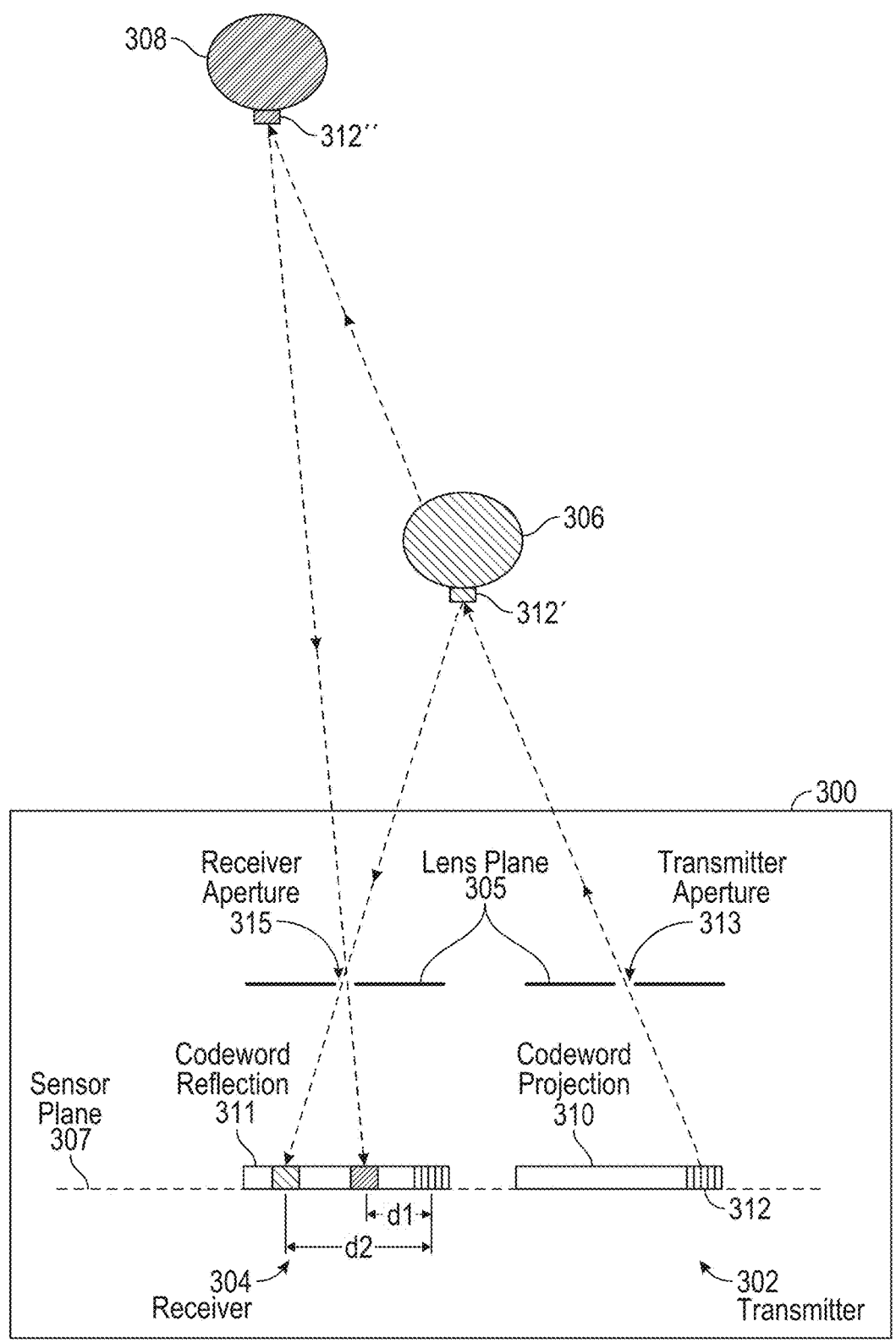
FIG. 3 is a schematic illustrating how depth may be sensed for an object or scene.

FIG. 3 illustrates an example of how "depth" may be sensed for an object or scene. FIG. 3 shows a device 300 including a transmitter 302 and a receiver 304. The device is illuminating two objects 306 and 308 with structured light emitted from transmitter 302 as codeword projection 310. The codeword projection 310 reflects from objects 306 and/or 308 and is received as a codeword reflection 311.

In the illustrated aspect, the transmitter 302 is on the same baseline reference plane (e.g., lens plane 305) as the receiver 304. The transmitter 302 projects the code mask 310 onto the objects 306 and 308 through a lens or aperture 313.

The codeword projection 310 illuminates the object 306 as projected segment 312', and illuminates the object 308 as projected segment 312". When the projected segments 312' and 312" are received by the receiver 304 through receiver lens or aperture 315, the codeword reflection 311 may show reflections generated from the object 308 at a first distance d1 and reflections generated from the object 306 at a second distance d2.

As shown by FIG. 3, since the object 306 is located closer to the transmitter 302 (e.g., a first distance from the transmitter device) the projected segment 312' appears at a distance d2 from its initial location. In contrast, since the object 308 is located further away (e.g., a second distance from the transmitter 302), the projected segment/portion/window 312" appears at a distance d1 from its initial location (where d1<d2). That is, the further away an object is from the transmitter/receiver, the closer the received projected segment/portion/window is from its original position at the receiver 304 (e.g., the outgoing projection and incoming projection are more parallel). Conversely, the closer an object is from the transmitter/receiver, the further the received projected segment/portion/window is from its original position at the receiver 304. Thus, the difference between received and transmitted codeword position may be used as an indicator of the depth of an object. In one example, such depth (e.g., relative depth) may provide a depth value for objects depicted by each pixel or grouped pixels (e.g., regions of two or more pixels) in an image.

Various types of modulation and coding schemes have been conceived to generate a codeword projection or code mask. These modulation and coding schemes include temporal coding, spatial coding, and direct codification.

In temporal coding, patterns are successively projected onto the measuring surface (e.g., over time). This technique has high accuracy and resolution but is less suitable for dynamic scenes.

In spatial coding, information is encoded in a local neighborhood based on shapes and patterns. Pseudorandom codes may be based on De-Bruijn or M-arrays define the codebook (e.g., m-ary intensity or color modulation). Pattern segmentation may not be easily attained, for example, where the shapes and patterns are distorted.

In direct codification, both horizontal and vertical pixel coordinates are encoded. Modulation may be by a monotonic phase or an intensity waveform. However, this scheme may utilize a codebook that is larger than the codebook utilized for other methods. In most methods, received codewords may be correlated against a defined set of possible codewords (e.g., in a codebook). Thus, use of a small set of codewords (e.g., small codebook) may provide better performance than a larger codebook. Also, since a larger codebook results in smaller distances between codewords, additional errors may be experienced by implementations using larger codebooks.

Exemplary Codes for Active Depth Sensing

Structured light patterns may be projected onto a scene by shining light through a code mask. Light projected through the code mask may contain one or more tessellated code mask primitives. Each code mask primitive may contain an array of spatial codes. A codebook or data structure may include the set of codes. Spatial codes, the code mask, and code mask primitives may be generated using basis functions. Periodicities of the basis functions may be chosen to meet the requirements for the aggregate pattern of Hermitian symmetry (for eliminating ghost images and simplifying manufacturing), minimum duty cycle (to ensure a minimum power per codeword), perfect window property (for optimum contour resolution and code packing for high resolution), and randomized shifting (for improved detection on object boundaries). A receiver may make use of the codebook and/or the attributes of the design of the spatial codes, code mask, and code mask primitives when demodulating, decoding and correcting errors in received patterns.

The size and corresponding resolution of the spatial codes corresponds to a physical spatial extent of a spatial code on a code mask. Size may correspond to the number of rows and columns in a matrix that represents each codeword. The smaller a codeword, the smaller an object that can be detected. For example, to detect and determine a depth difference between a button on a shirt and the shirt fabric, the codeword should be no larger than the size of the button. In an embodiment, each spatial code may occupy four rows and four columns. In an embodiment, the codes may occupy more or fewer rows and columns (rows×columns), to occupy, for example, 3×3, 4×4, 4×5, 5×5, 6×4, or 10×10 rows and columns.

The spatial representation of spatial codes corresponds to how each codeword element is patterned on the code mask and then projected onto a scene. For example, each codeword element may be represented using one or more dots, one or more line segments, one or more grids, some other shape, or some combination thereof.

The "duty cycle" of spatial codes corresponds to a ratio of a number of asserted bits or portions (e.g., "1s") to a number of un-asserted bits or portions (e.g., "0s") in the codeword. When a coded light pattern including the codeword is projected onto a scene, each bit or portion that has a value of "1" may have energy (e.g., "light energy"), whereas each bit having a value of "0" may be devoid of energy. For a codeword to be easily detectable, the codeword should have sufficient energy. Low energy codewords may be more difficult to detect and may be more susceptible to noise. For example, a 4×4 codeword has a duty cycle of 50% or more if 8 or more of the bits in the codeword are "1." There may be minimum (or maximum) duty cycle constraints for individual codewords, or duty cycle constraints such as an average duty cycle for the set of codes in the codebook.

The "contour resolution" or "perfect window" characteristic of codes indicates that when a codeword is shifted by a small amount, such as a one-bit rotation, the resulting data represents another codeword. An amount that the codeword is shifted may be referred to as a shift amount. Codes with high contour resolution may enable the structured light depth sensing system to recognize relatively small object boundaries and provide recognition continuity for different objects. A shift amount of 1 in the row dimension and 2 in the column dimension may correspond to a shift by one bit positions to the right along the row dimension, and two bit positions down along the column dimension. High contour resolution sets of codewords make it possible to move a window on a received image one row or one column at a time, and determine the depth at each window position. This enables the determination of depth using a 5×5 window at a starting point centered at the third row and third column of a received image, and moving the 5×5 window to each row, column location from the third row to the third to last row, and the third column to the third to last column. As the codewords overlap, the window may be sized based on the resolution of the object depths to be determined (such as a button on a shirt).

The symmetry of codes may indicate that the code mask or codebook primitive has Hermitian symmetry, which may provide several benefits as compared to using non-Hermitian symmetric codebook primitives or patterns. Patterns with Hermitian symmetries are "flipped" or symmetric, along both X and Y (row and column) axes.

The aliasing characteristic of code masks or code mask primitives corresponds to a distance between two codewords that are the same. When an optical pattern includes a tessellated codebook primitive, and when each codebook in the primitive is unique, the aliasing distance may be based on the size of the codebook primitive. The aliasing distance may thus represent a uniqueness criterion indicating that each codeword of the codebook primitive is to be different from each other codeword of the codebook primitive, and that the codebook primitive is unique as a whole. The aliasing distance may be known to one or more receiver devices, and used to prevent aliasing during codeword demodulation.

The cardinality of a code mask corresponds to a number of unique codes in a codebook primitive.

Exemplary Transmitter Device

Figure 4:
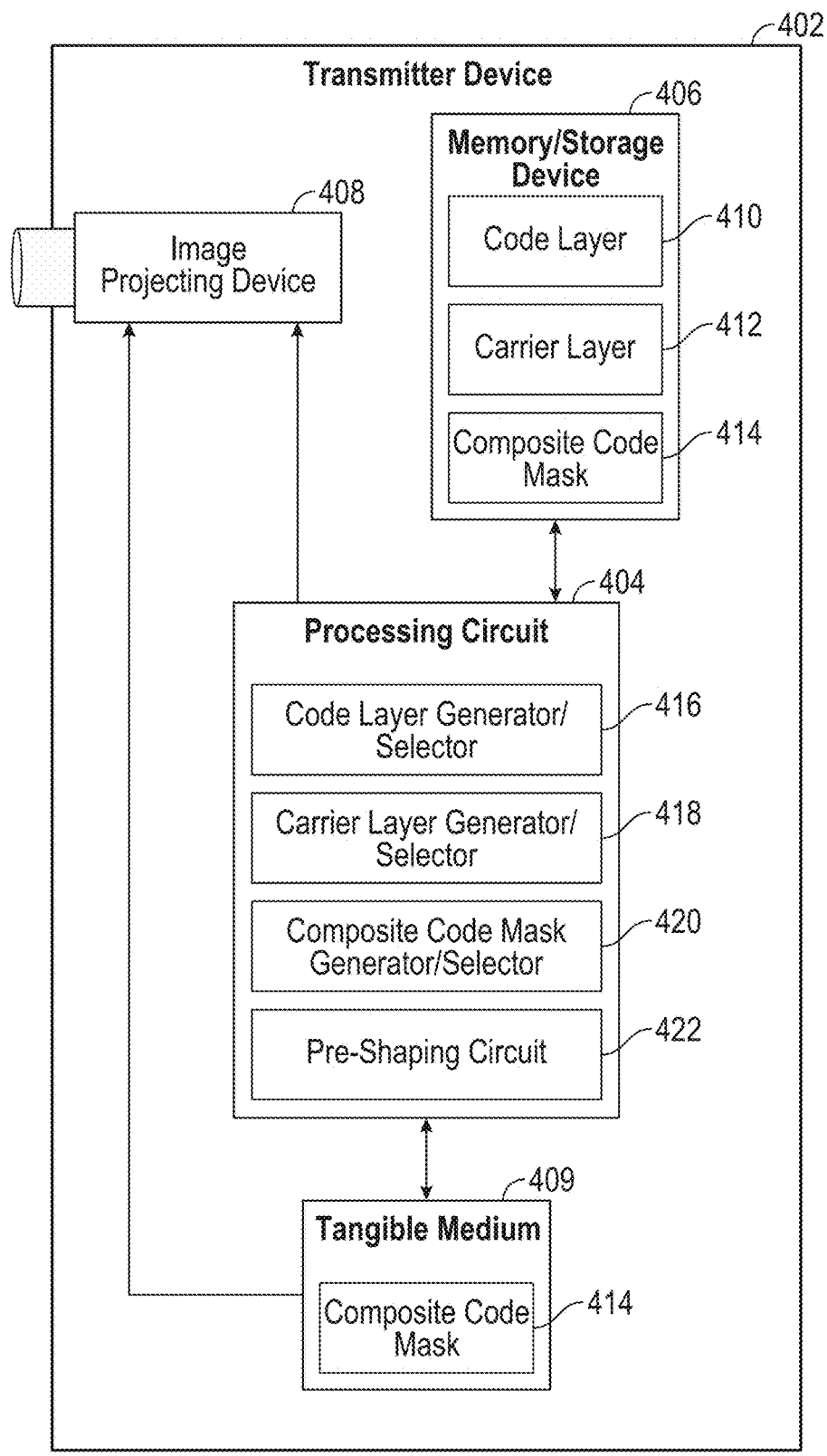
FIG. 4 is a block diagram illustrating an example of a transmitter device that may be configured to generate a composite code mask and/or project such composite code mask.

FIG. 4 is a block diagram illustrating an example of a transmitter device that may be configured to generate a composite code mask and/or project such composite code mask. The transmitter device 402 may include a processing circuit 404 coupled to a memory/storage device, an image projecting device 408, and/or a tangible medium 409. In some aspects, the transmitter device 402 may correspond to the transmitter 302 discussed above with respect to FIG. 3.

In a first example, the transmitter device 402 may be coupled to include a tangible medium 409. The tangible medium may define, include, and/or store a composite code mask 414, the composite code mask including a code layer combined with a carrier layer. The code layer may include uniquely identifiable spatially-coded codewords defined by a plurality of symbols. The carrier layer may be independently ascertainable and distinct from the code layer and includes a plurality of reference objects that are robust to distortion upon projection. At least one of the code layer and carrier layer may be pre-shaped by a synthetic point spread function prior to projection.

In a second example, the processing unit 404 may include a code layer generator/selector 416, a carrier layer generator/selector 418, a composite code mask generator/selector 420 and/or a pre-shaping circuit 422. The code layer generator/selector 416 may select a pre-stored code layer 410 and/or may generate such code layer. The carrier layer generator/selector 418 may select a pre-stored carrier layer 412 and/or may generate such carrier layer. The composite code mask generator/selector may select a pre-stored composite code mask 414 and/or may combine the code layer 410 and carrier layer 412 to generate the composite code mask 414. Optionally, the processing circuit 404 may include a pre-shaping circuit that pre-shapes the composite code mask 414, the code layer 410, and/or the carrier layer 412, to compensate for expected distortion in the channel through which the composite code mask is to be projected.

In some implementations, a plurality of different code layers and/or carrier layers may be available, where each such carrier or code layers may be configured for different conditions (e.g., for objects at different distances, or different configurations between the transmitter device and receiver device). For instance, for objects within a first distance or range, a different combination of code and carrier layers may be used than for objects at a second distance or range, where the second distance is greater than the first distance. In another example, different combination of code and carrier layers may be used depending on the relative orientation of the transmitter device and receiver device.

The image projecting device 408 may serve to project the generated/selected composite code mask onto an object of interest. For instance, a laser or other light source may be used to project the composite code mask onto the object of interest (e.g., through a projection channel). In one example, the composite code mask 414 may be projected in an infrared spectrum, so it may not be visible to the naked eye. Instead, a receiver sensor in the infrared spectrum range may be used to capture such projected composite code mask.

Exemplary Receiver Device Operation

Figure 5:
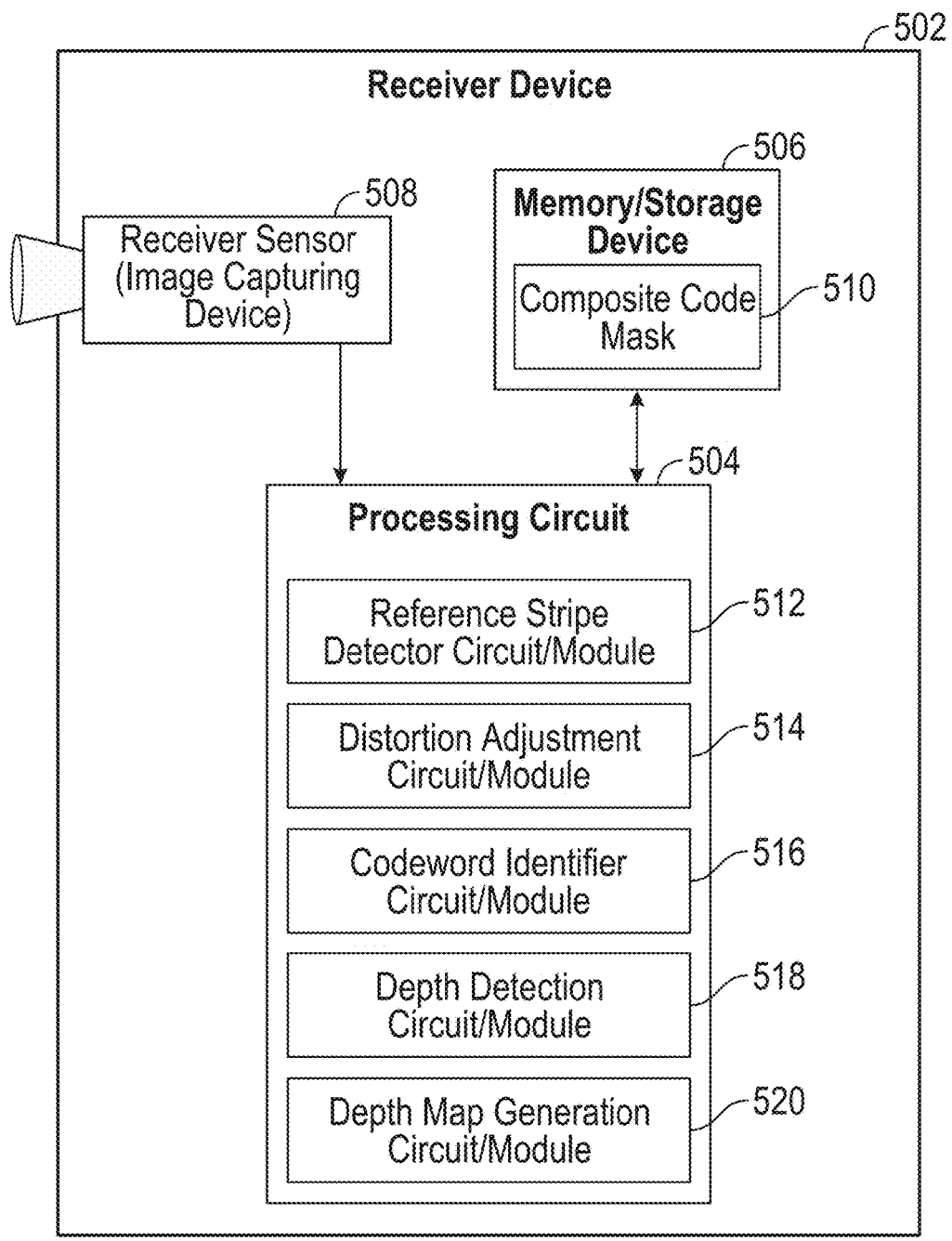
FIG. 5 is a block diagram illustrating an example of a receiver device that may be configured to obtain depth information from a composite code mask.

FIG. 5 is a block diagram illustrating an example of a receiver device 502 that may be configured to obtain depth information from a composite code mask. The receiver device 502 may include a processing circuit 504 coupled to a memory/storage device and a receiver sensor 508 (e.g., an image capturing device 508). In some aspects, the receiver device 502 illustrated in FIG. 5 may correspond to the receiver 304 discussed above with respect to FIG. 3.

The receiver sensor 508 (e.g., camera) may serve to obtain at least a portion of a composite code mask projected on the surface of an object. For instance, the receiver sensor may capture at least a portion of a composite code mask projected on the surface of a target object. The composite code mask may be defined by: (a) a code layer of uniquely identifiable spatially-coded codewords defined by a plurality of symbols, and (b) a carrier layer independently ascertainable and distinct from the code layer and including a plurality of reference objects that are robust to distortion upon projection. At least one of the code layer and carrier layer may have been pre-shaped by a synthetic point spread function prior to projection. In one example, the receiver sensor 508 may capture the composite code mask in the infrared spectrum.

In an implementation, the code layer may comprise n1 by n2 binary symbols, where n1 and n2 are integers greater than two. In the composite code mask, each symbol may be a line segment in one of two gray-scale shades distinct from the reference objects. The symbols of the code layer may be staggered in at least one dimension. The carrier layer reference objects may comprise a plurality of equally spaced reference stripes with a guard interval in between. The reference stripes and the guard interval may be of different widths. The width of each reference stripe relative to a guard interval width may be determined by an expected optical spreading of a transmitter device and/or a receiver device.

The processing circuit 504 may include a reference stripe detector circuit/module 512, a distortion adjustment circuit/module 514, a codeword identifier circuit/module 516, a depth detection circuit/module 518, and/or a depth map generation circuit/module 520.

The reference stripe detector circuit/module 512 may be configured to detect reference stripes within the portion of the composite code mask. The distortion adjustment circuit/module 514 may be configured to adjust a distortion of the portion of the composite code mask based on an expected orientation of the reference stripes relative to an actual orientation of the reference stripes. The codeword identifier circuit/module 516 may be configured to obtain a codeword from a window defined within the portion of the composite code mask. The depth detection circuit/module 518 may be configured to obtain depth information for a surface portion of the target object corresponding to the window based on: (a) a single projection of the composite code mask, and (b) a displacement of the window relative to a known reference code mask.

Still referring to FIG. 5, the depth map generation circuit/module 520 may be configured to assemble a depth map for the object based on a plurality of codewords detected as different overlapping windows within the portion of the undistorted composite code mask.

In one example, pre-shaping of at least one of the code layer and carrier layer increases power efficiency during the projection of the composite code mask, such that more power is perceived by a receiver sensor in comparison to an unshaped composite code mask.

In one instance, the synthetic point spread function used may be selected from a plurality of point spread functions based on at least one of: (a) expected channel conditions through which the composite code mask is to be projected, (b) characteristics of surfaces onto which the composite code mask is projected, and/or (c) a sensitivity of the receiver sensor which is to receive the projected composite code mask. In another example, the synthetic point spread function may be selected from a plurality of point spread functions based on at least one of: (a) a first channel response for a projector that is to project the composite code mask; and/or (b) a second channel response for a path from a projector, that is to project the composite code mask, to the receiver sensor, that is to receive the composite code mask.

Exemplary Error Correction Device

Figure 6:
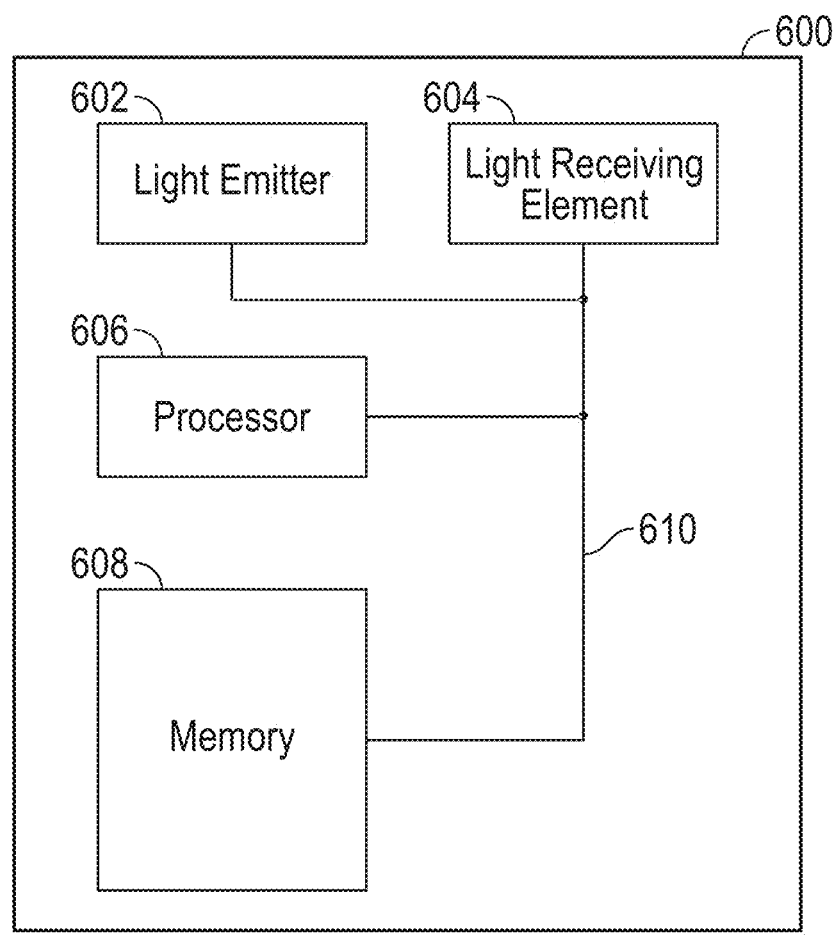
FIG. 6 is a block diagram of one embodiment of an apparatus configured to perform one or more of the error correction methods disclosed herein.

FIG. 6 is a block diagram illustrating an embodiment of an apparatus configured to perform one or more of the error correction methods disclosed herein. Apparatus 600 includes a light emitter 602, a light receiving element 604, a processor 606, and a memory 608. The light emitter 602, light receiving element 604, processor 606, and the memory 608 are operably connected via a bus 610. In some aspects, the light receiving element 604 may correspond to the receiver device 502 discussed above with respect to FIG. 5. In some aspects, the light emitter 602 may correspond to the transmitter device 402 discussed above with respect to FIG. 4.

The memory 608 may store instructions that configure the processor 606 to perform one or more functions of the methods discussed herein. For example, instructions stored in the memory may configure the processor 606 to control the light emitter 602 to emit light that encodes structured light as codewords, in order to illuminate a target object. Instructions stored in the memory 608 may further cause the processor 606 to control the light receiving element 604 to receive light reflecting from the target object and produce data encoded in the reflected light. Instructions stored in the memory may further configure the processor to correct errors in the data produced by the light receiving element according to the method 1500 discussed below.

Figure 7:
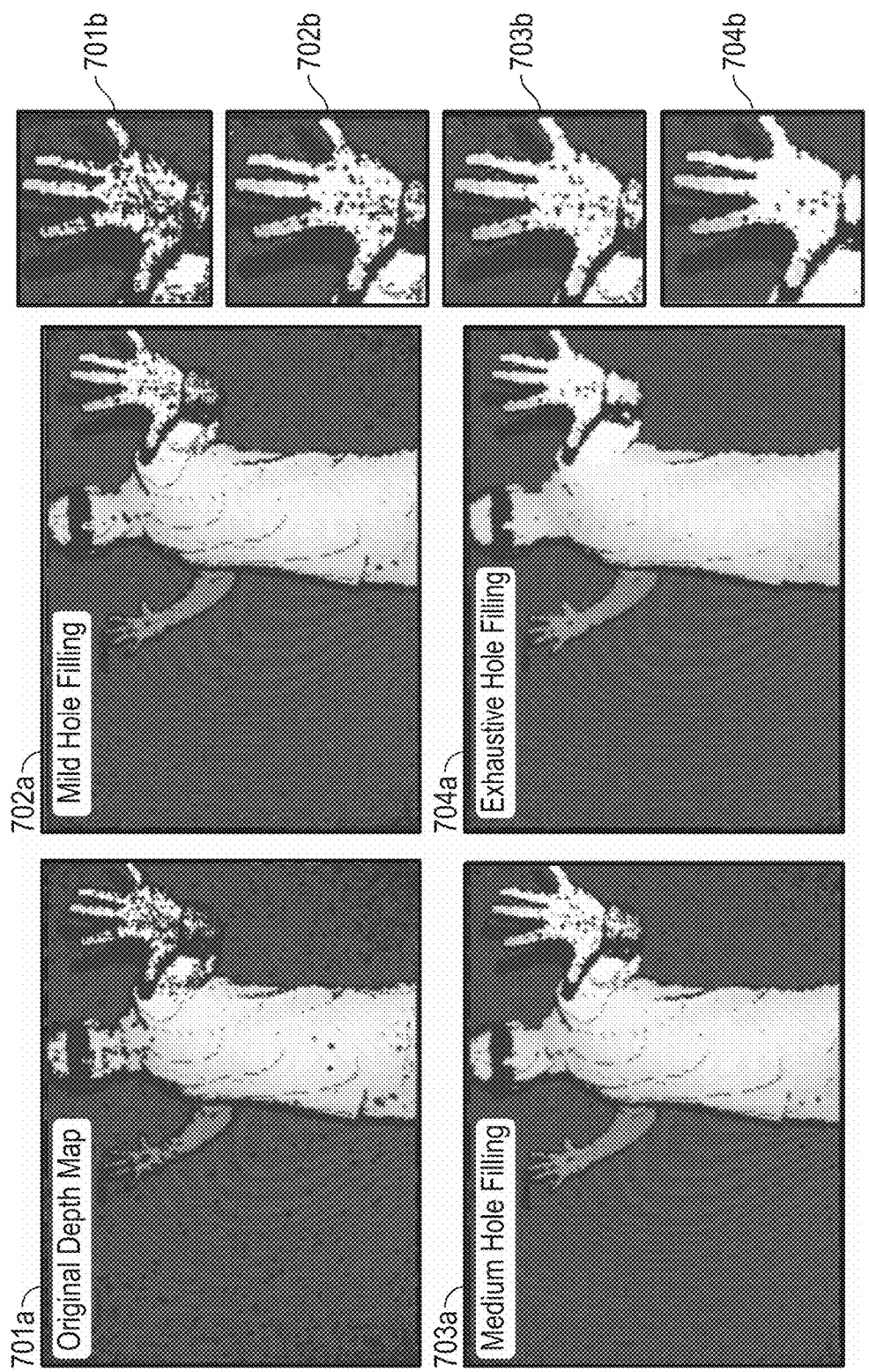
FIG. 7 shows varying degrees of error correction using a median filter.

FIG. 7 shows the results of application of known methods for mitigating the effects of gaps in an image depth map. Image 701a shows a depth map without any error correction. Holes in the depth map can be seen as dark regions, for example, in the hand 701b. Image 702a shows the same depth map after a mild hole filling process has been performed. While the hand 702b includes fewer holes in the depth map than hand 701a, some loss of detail is also present. Image 703a shows the same depth map as image 701a after medium level hole filling has been performed. The hand 703b from the image 703a shows a further reduction in the number of depth map gaps, but also loss of detail relative to the hands 701b and 702b. Image 704a shows the same depth map as image 701a after exhaustive hole filling. The hand 704b from the image 704a shows further reduction of depth map gaps as compared to hands 701b, 702b, and 703b. However, further loss of detail relative to hands 701b, 702b, and 703b is also evident.

Figure 8B:
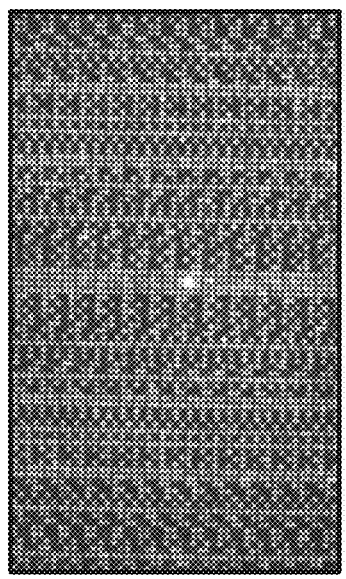
FIG. 8B illustrates an example of a Hermitian symmetric pattern without ghost images.
Figure 8C:
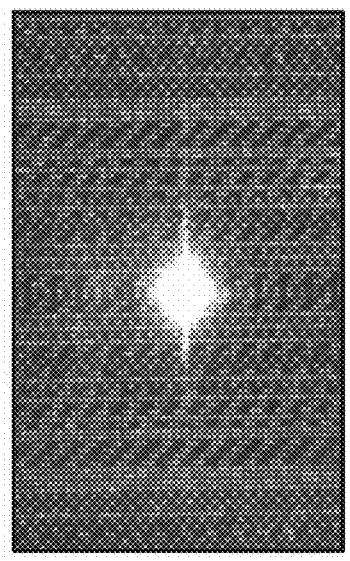
FIG. 8C illustrates an example of a code mask pattern with Hermitian symmetry.
Figure 8D:
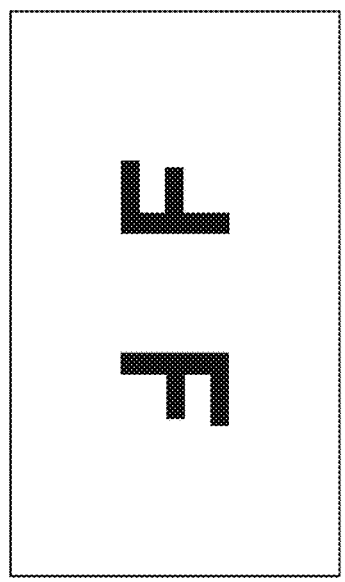
FIG. 8D illustrates an example of a non-Hermitian symmetric pattern with ghost images.
Figure 8E:
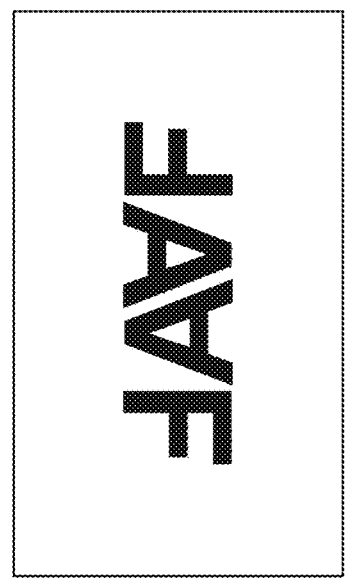
FIG. 8E illustrates an example of a code mask pattern without Hermitian symmetry.
Figure 8A:
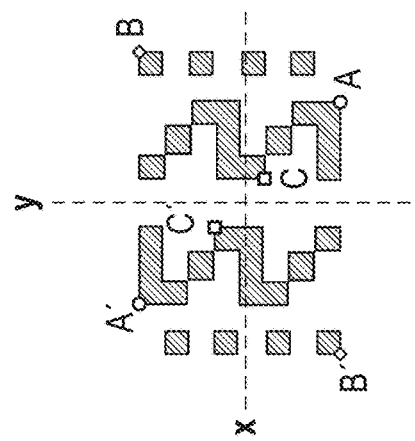
FIG. 8A illustrates an example of a pattern with points that exhibit Hermitian symmetry.

FIG. 8A illustrates a pattern that exhibits Hermitian symmetry. Each point A, B, C with a positive (x,y) is included in a codebook primitive, and is reflected about an origin (e.g., a point (0,0)) to a point (−x,−y) that is also in the codebook primitive. The Hermitian symmetry exhibited by each of the points A, B, C, may inhibit formation of "ghost" images that may be received when non-Hermitian patterns are used. For example, FIG. 8B illustrates a pattern without ghost images, formed from a Hermitian symmetric code mask. In contrast, FIG. 8D illustrates a pattern with ghost images, formed from a code mask that isn't Hermitian symmetric. Eliminating ghost images may reduce receiver side signal processing, may increase codeword recognition and demodulation accuracy, increase tolerance to moving objects, increase tolerance to noise, and increase tolerance to illumination changes.

FIGS. 8C and 8E show how a Hermitian symmetric pattern may affect the size of a zero order beam in a structured light projection. As shown, the Hermitian symmetric pattern of FIG. 8C generated a smaller zero order beam when compared to a zero order beam shown in FIG. 8E with a non-Hermitian symmetric pattern. The zero order beam is generated when light, such as laser light, passes through a code mask, and a portion of the light passes through the center of the code mask un-diffracted. This causes the zero-order beam. Because the zero-order beam is not diffracted, the zero-order beam may have higher intensity than diffracted beams, resulting in a blind spot and saturation of a receive image sensor about the position of the zero order beam. The reduced size and lower intensity of the zero order beam in FIG. 8C may reduce the size of the blind spot, and improve eye-safety in systems using a laser light as compared to the non-Hermitian symmetric pattern used in FIG. 8E.

Figure 9:
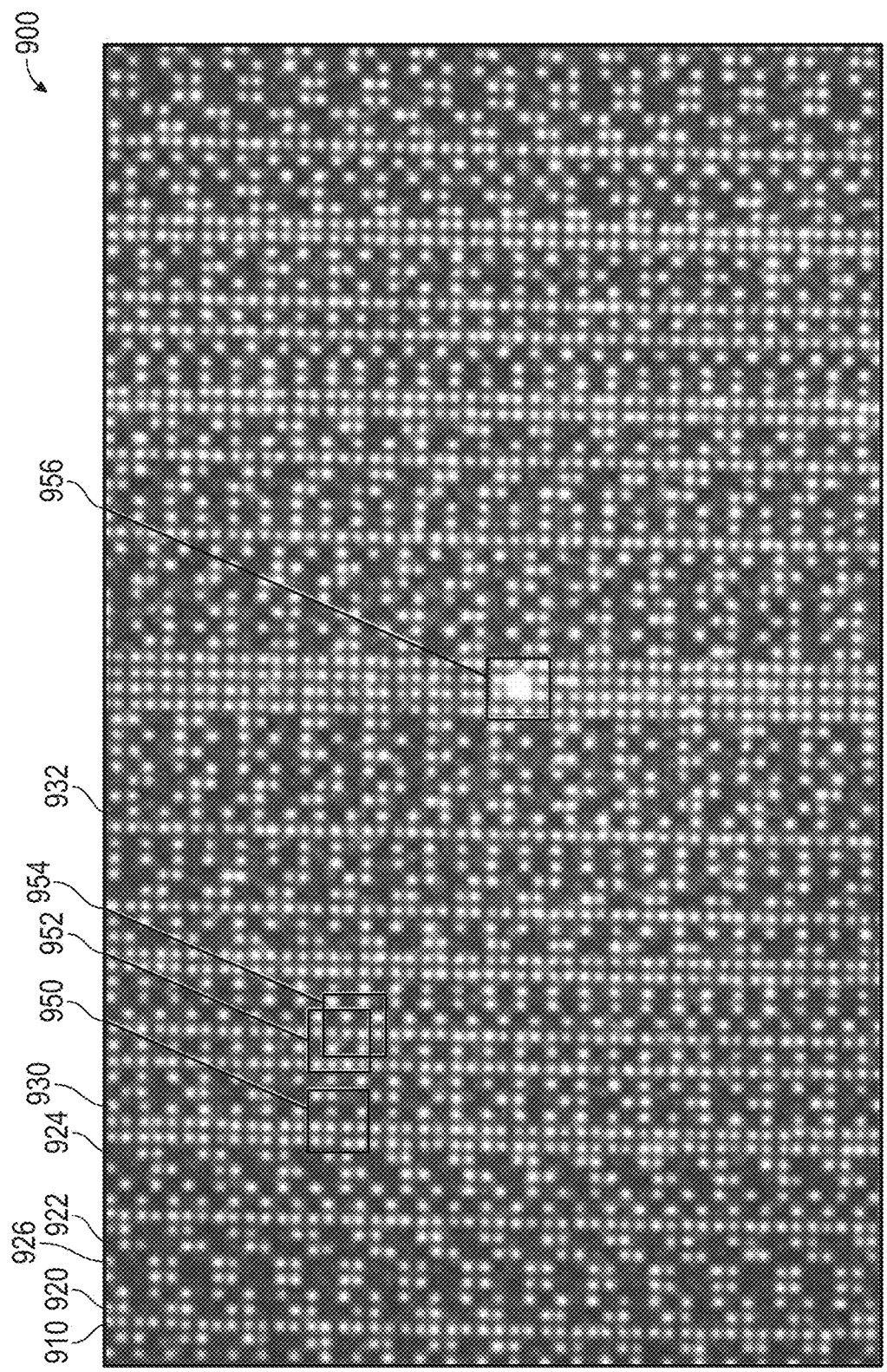
FIG. 9 illustrates a detailed view of the exemplary code mask illustrated in FIG. 8C, with columns of different basis functions and windowed 4×4 spatial codes.

FIG. 9 illustrates a detailed view of the exemplary code mask illustrated in FIG. 8C. Encoded data within the columns of the code mask 900 may be generated based on a set of basis functions. The basis functions are used to form spatial codes. The design of basis functions (basis sequences) may be analogous to eigenvectors for a matrix, in that the basis functions may be chosen to be orthogonal to each other, and may be combined linearly.

The code mask of FIG. 9 illustrates a code mask generated from three basis functions. A white square in the pattern represents a value of one (1) while a dark square represents a value of zero (0). In the illustrated code mask of FIG. 9, each column encodes values from one of the three basis functions:

$$910\begin{bmatrix}1\\1\\1\\1\end{bmatrix}, 920\begin{bmatrix}1\\1\\0\\0\end{bmatrix}, \text{ or } 930\begin{bmatrix}1\\0\\1\\0\end{bmatrix}.$$

When generating a particular column, each basis function may be rotated. Rotating 910 does not result in a change, as all bits are equivalent. Basis function $$920\begin{bmatrix}1\\1\\0\\0\end{bmatrix}$$

may be rotated, one bit at a time, to $$922\begin{bmatrix}0\\1\\1\\0\end{bmatrix}, 924\begin{bmatrix}0\\0\\1\\1\end{bmatrix}, \text{ or } 926\begin{bmatrix}1\\0\\0\\1\end{bmatrix}.$$

Similarly, basis function $$930\begin{bmatrix}1\\0\\1\\0\end{bmatrix}$$

may be rotated to $$932\begin{bmatrix}0\\1\\1\\1\end{bmatrix}.$$

Each column in the code mask 900 corresponds to a repeating series of one of these functions 910, 920, 922, 924, 926, 930, or 932.

The patterns resulting from the (sometimes rotated) basis functions are organized into codes comprised of four column portions, each column portion consisting of one four cell basis function pattern. For example, a code 950 may be represented as $$\begin{bmatrix}1 & 1 & 0 & 1\\1 & 1 & 1 & 1\\1 & 1 & 0 & 0\\1 & 1 & 1 & 0\end{bmatrix},$$

corresponding to functions [910|910|932|920].

Code 950 may be stored in a codebook in image form, as a 4×4 binary matrix, as binary representation of the binary matrix (for example, by column 1111111101011100, or by row 1101111111001110), as a combination of basis functions with a phase (910, 910, 930+1, 920), or as a combination of functions (910, 910, 932, 920).

In a similar manner, code $$952\begin{bmatrix}1 & 0 & 1 & 1\\1 & 1 & 1 & 0\\1 & 0 & 1 & 1\\1 & 1 & 1 & 0\end{bmatrix}$$

is formed from basis functions [910|932|910|930], code $$954\begin{bmatrix}1 & 1 & 0 & 1\\0 & 1 & 1 & 0\\1 & 1 & 0 & 1\\0 & 1 & 1 & 0\end{bmatrix}$$

is formed from basis functions [930|910|932|930], and code $$956\begin{bmatrix}1 & 1 & 1 & 1\\1 & 1 & 1 & 1\\1 & 1 & 1 & 1\\1 & 1 & 1 & 1\end{bmatrix}$$

is formed from [910|910|910|910].

A code may be identified for every four by four element "window" in the code mask of FIG. 9. The identifiable codes "overlap" as shown by codes 952 and 954, in that each 4×4 portion of code mask 900 represents a valid code. Because of the contour resolution (perfect window) constraint to which the code mask 900 is designed, each 4×4 "window" forms a valid code from a combination of 910, 920, 922, 924, 926, 930, or 932.

The perfect window constraint used in the design of the code mask pattern of FIG. 9 also requires shifted codewords to be unique. One window into the code mask corresponds to a four by four window shown in locations 950, 952, 954, and 956. As the window shifts by one or more rows, and/or one or more columns, the four by four codeword within the window needs to be unique and non-repeating over an anti-alias area. If the codewords are not unique, then it may not be possible to uniquely identify each codeword location (window location corresponding to each unique codeword) within the anti-alias area. For this example with seven functions 910, 920, 922, 924, 926, 930, and 932, and four columns, there are $7^4$=2,401 possible combinations of four columns, making it possible to meet the perfect window constraint over anti-aliasing areas of up to 2,401 columns.

Two other candidate basis functions for 4×4 codes that were not used in this example are $$\begin{bmatrix}1\\1\\1\\0\end{bmatrix}, \text{ and } \begin{bmatrix}0\\0\\0\\0\end{bmatrix}.$$

No columns in the pattern use these functions, or shifted versions of these functions. Therefore, any received code that includes either $$\begin{bmatrix}1\\1\\1\\0\end{bmatrix} \text{ or } \begin{bmatrix}0\\0\\0\\0\end{bmatrix}$$

is invalid codes. Accordingly, a receiver may detect an error when a received code is not in a codebook of valid codes, when all transmitted codes are formed from a basis function (or rotated version of the basis function) that is in the codebook.

Figure 10:
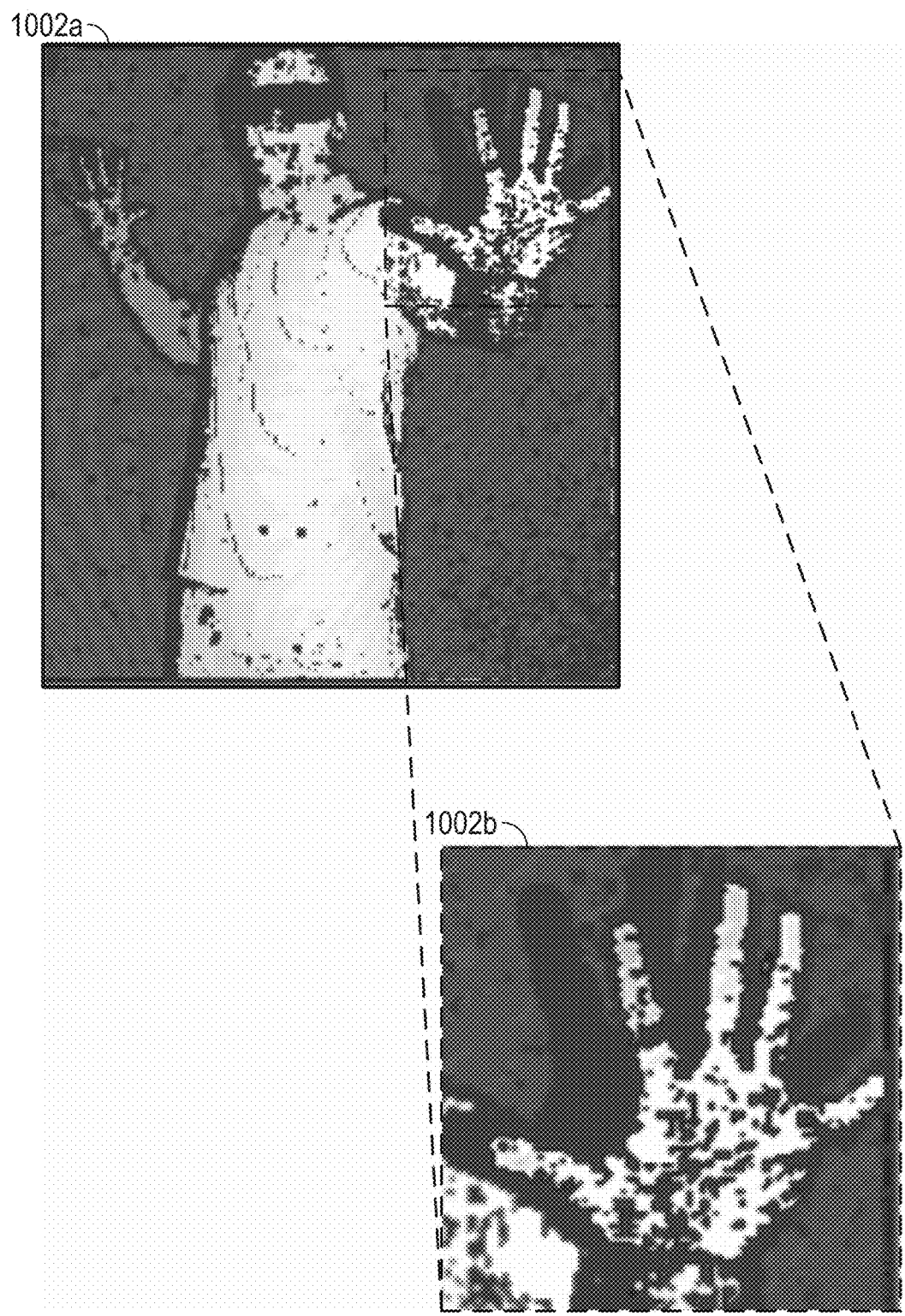
FIG. 10 shows gaps in a depth map derived from structured light.

The code mask 900 of FIG. 9 may be transmitted onto one or more objects in a scene, and then reflected back to a receiver. The receiver, such as receiver 502 or light receiving element 604, receives the reflection of the transmitted pattern from the objects in the scene. After reception, received versions of codes at windows 950, 952, 954, and 956 may be determined. By observing how the encoded codewords change when reflected by an object, a depth map such as the depth map 1002a shown in FIG. 10 may be generated. The generated depth map may be provided to one or more image processing methods, which may modify image data based on the depth map. The generated depth map may include one or more gaps or holes. The gaps or holes may result from errors in decoding of the received versions of the codes. The errors may be caused by a variety of factors, including portions of the object with low reflectivity, spurious ambient light conditions, or a variety of other factors. Examples of holes in a depth map can be seen in the expanded image of the hand 1002b. Without a means for correcting these errors, image processing of regions of the image in proximity to the holes may be inhibited, resulting in reduced visual quality of the processed image.

When the codewords of code mask 900 are received, each received codeword may be demodulated, or interpreted, to determine the code that was received.

In an embodiment, the received spatial codes, or symbolic (binary, or n-ary) representations of the received spatial codes, may be matched to basis functions (for example, using matched filters), shifted versions of basis functions, or each valid spatial code array to determine if the received code corresponds to a valid code. The code mask 900 may be generated to include valid codes representing only a subset of all possible combinations of basis functions. In the example of the 4×4 codes of FIG. 9, the seven functions 910, 920, 922, 924, 926, 930, and 932 correspond to $7^4$=2,401 possible codes out of $2^{16\ (4\times4)}$=65,536 possibilities.

A codebook used to generate the code mask 900 may select a subset of the 2,401 codes (for example, 400), in which case less than 1% of the possible codes are valid. If valid codes are dissimilar enough, a single bit error may not result in another valid code. Thus, it may be possible to determine the received code has an error if it does not match a valid code, and it is relatively unlikely or perhaps impossible for a single bit error to cause a first valid code to be mistaken for a second valid code.

The error correction systems and methods described herein detect an error when an invalid code is received, and correct the error by determining the most likely, valid, transmitted codeword that corresponds to the received invalid code. A determination of the most likely valid transmitted codeword may assume, in some aspects, that the invalid codeword includes only one error. This assumption bounds the computational requirements of determining the most likely valid codewords. Furthermore, given the relatively low probability of multiple errors in a single codeword, this assumption provides for methods and systems with an adequate ability to correct errors.

Figure 11:
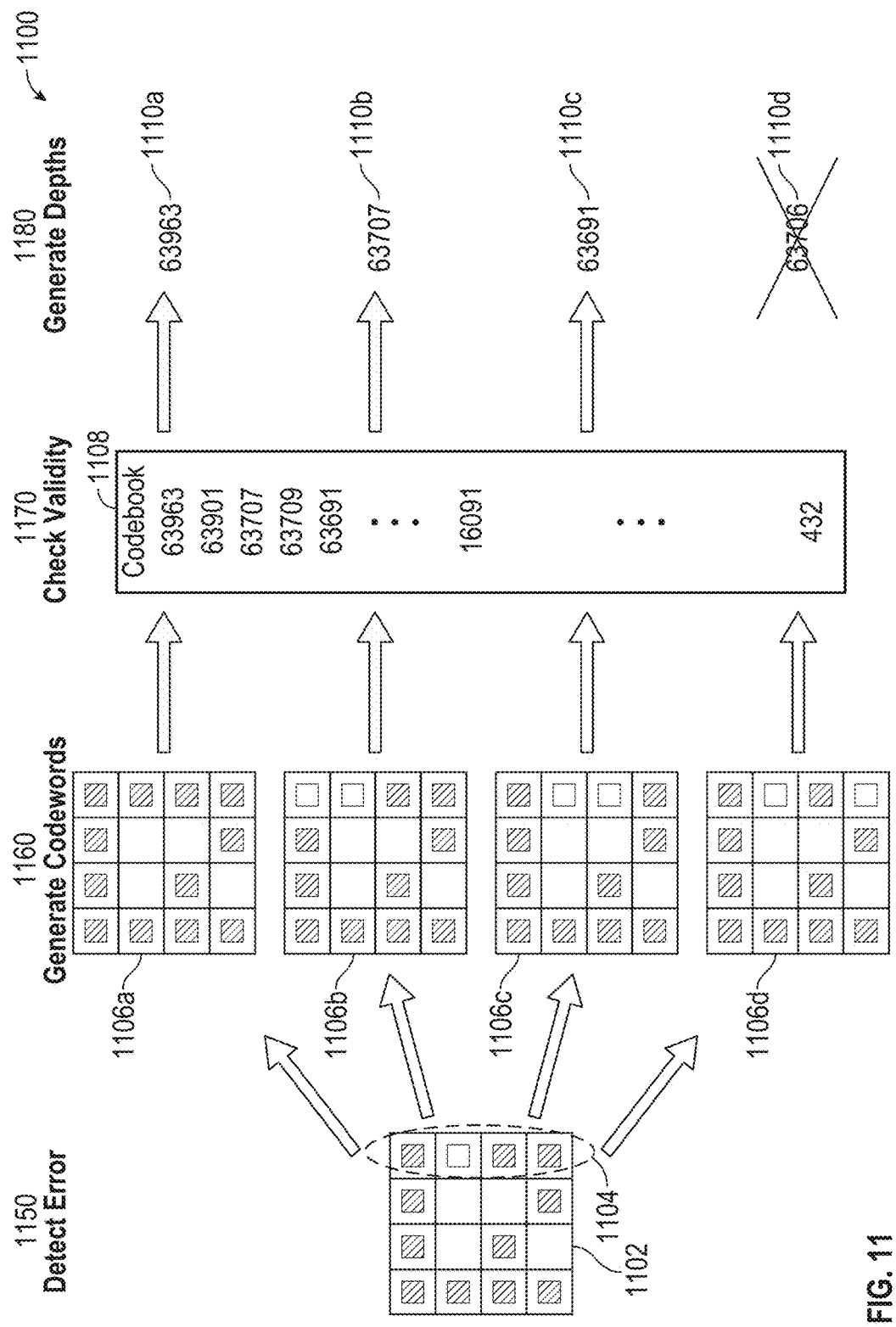
FIG. 11 is an example of a dataflow diagram of a method of depth map hole filling.

FIG. 11 is a dataflow diagram of a method of depth map hole filling. The method includes detecting an error in a received spatial codeword, in a detect error step 1150. Detecting an error may include determining that a received codeword is not included in a codebook listing valid codewords. After detecting an error, the method includes generating candidate valid codewords, in generate codewords step 1160. Each of the candidate codewords are checked against the set of valid codewords in check validity step 1170, to determine which of the candidate codewords are valid candidates. Next, depths are generated for each of the valid codewords in generated depths step 1180. FIG. 11 illustrates a dataflow for the example 4×4 spatial codes generated using the basis functions described with respect to FIG. 9, that is, the basis functions $$910\begin{bmatrix}1\\1\\1\\1\end{bmatrix}, 920\begin{bmatrix}1\\1\\0\\0\end{bmatrix}, \text{ and } 930\begin{bmatrix}1\\0\\1\\0\end{bmatrix},$$

as well as shifted functions $$922\begin{bmatrix}0\\1\\1\\0\end{bmatrix}, 924\begin{bmatrix}0\\0\\1\\1\end{bmatrix}, 926\begin{bmatrix}1\\0\\0\\1\end{bmatrix} \text{ and } 932\begin{bmatrix}0\\1\\0\\1\end{bmatrix}.$$

FIG. 11 first vertically illustrates an error detection process 1150. Within error detection process 11150, a received spatial code 1102 is decoded. The decoded spatial code 1102 may result from a reflection of at least one of the spatial codes described above with respect to FIG. 9. Each received spatial column in the special code 1102 is compared to the set of basis functions of FIG. 9 using a match filter. The first, second, and third columns of 1102 match functions 910, 930, and 926, respectively. However, column 1104 does not match any of functions 910, 920, 922, 924, 926, 930, or 932, signifying an error in at least one of the elements of column 1104.

Once error detection process 1150 detects an error in column 1104 of spatial codeword 1102, candidate valid codewords are generated in candidate codeword generation step 1160, illustrated vertically in FIG. 11.

Example candidate generation step 1160 of FIG. 11 includes a design assumption that only one error exists in column 1104. Other contemplated embodiments may make different assumptions, for example, other embodiments may assume no more than two, three, or four errors exist in column 1104. However, detecting and correcting for a larger number of errors may require a higher computational cost and complexity. In some aspects, candidate codewords may be generated to be within a particular Hamming distance of the invalid code. For example, in implementations assuming at most one error in an invalid codeword, candidate codewords may be generated that have a Hamming distance of one (1) from the invalid codeword. In implementations that contemplate at most two errors in column 1104, candidate codewords may be generated that are within a Hamming distance of two (2) from the invalid codeword 1102, and so on.

As shown in FIG. 11, candidate codewords 1106a-d are generated in codeword generation step 1160. Each of candidate codewords 1106a-d has a Hamming distance of one (1) from the invalid codeword 1102. This corresponds to the single bit error assumption discussed above. Alternatively the candidate codewords 1106a-d may be generated by a variety of other methods, depending on implementation. In one implementation, each candidate codeword is generated by perturbing (or changing) a unique bit of the column 1104 including the error. Thus, if the column 1104 where to include eight bits, eight candidate codewords may be generated, each candidate codeword including a different perturbed bit.

After the candidate codewords 1106a-d are generated, each of the candidate codewords may then be checked for validity in a validity step 1170. Validity may be determined in some aspects by determining whether the candidate codewords are included in a codebook 1108 of valid codes used to generate the code mask 900. If exactly one of the candidate replacements 1106a-d is a valid code (listed in the codebook 1108) then the single matching candidate is likely the valid code that was originally transmitted. In the example of FIG. 11, codes 1106a-c were found to be valid in codebook 1108, while code 1106d was not found in codebook 1108. Note that if none of the candidate codewords were determined to be valid (i.e. in the codebook 1108), some implementations may determine that the invalid codeword column 1104 includes more than a single error. In response to this determination, some implementations may perform a second candidate codeword generation step. For example, candidate codewords within a Hamming distance of two (2) from the invalid codeword may be generated and compared to the codebook 1108. Some implementations may perform additional steps for candidate codewords with greater Hamming distances from the invalid codewords. Some implementations may determine candidate codewords at the closest Hamming distance in a single step.

In some embodiments, the validity check process 1170 may be performed based on a codeword allocation scheme. For example, in some aspects, codewords in a horizontal direction may be unique in an x-dimension and repeating in a y-dimension. Some candidate codewords may not conform to such an overall codeword allocation schemes, and may be rejected during the validity check 308.

After the validity check 1170 is performed, the generated depth step 1180 determines the depth associated with each candidate valid codewords 1110a-c. The candidate depths associated with codewords 1110a-c may be compared to depths within a local neighborhood to determine which one of the candidate codewords 1110a-c should replace the invalid codeword 1102. For example, whichever candidate depth 1110a-c is closest to local neighborhood depth values of invalid codeword 1102 may be used to replace invalid codeword 1102 in a depth map. In some cases, the local neighborhood may be limited to 1, 2, 3, 4, 5, 6, 7, 8, 9, or 10 codewords from invalid codeword 1102. In some aspects, the local neighborhood may be limited to codewords within a percent of a depth map width or height. For example, if a depth map is 100 codewords across, the local neighborhood may be defined to be one (1) percent of this dimension, or within one codeword of invalid codeword 1102. More detail on the generate depth step 1180 is described below with respect to FIG. 12.

Note that some example decoded codewords 1102 may include errors in more than one column. For example a first and third column of a 4×4 codeword may each include an error. In this case, candidate codewords may be generated for the eight potential candidates (four for each column in the case of a 4×4 codeword), each candidate is validated against the codebook, depths are generated for each valid candidate, and the most similar depth is selected for replacement. A method may set an upper limit on the number of bit errors to consider.

Figure 12:
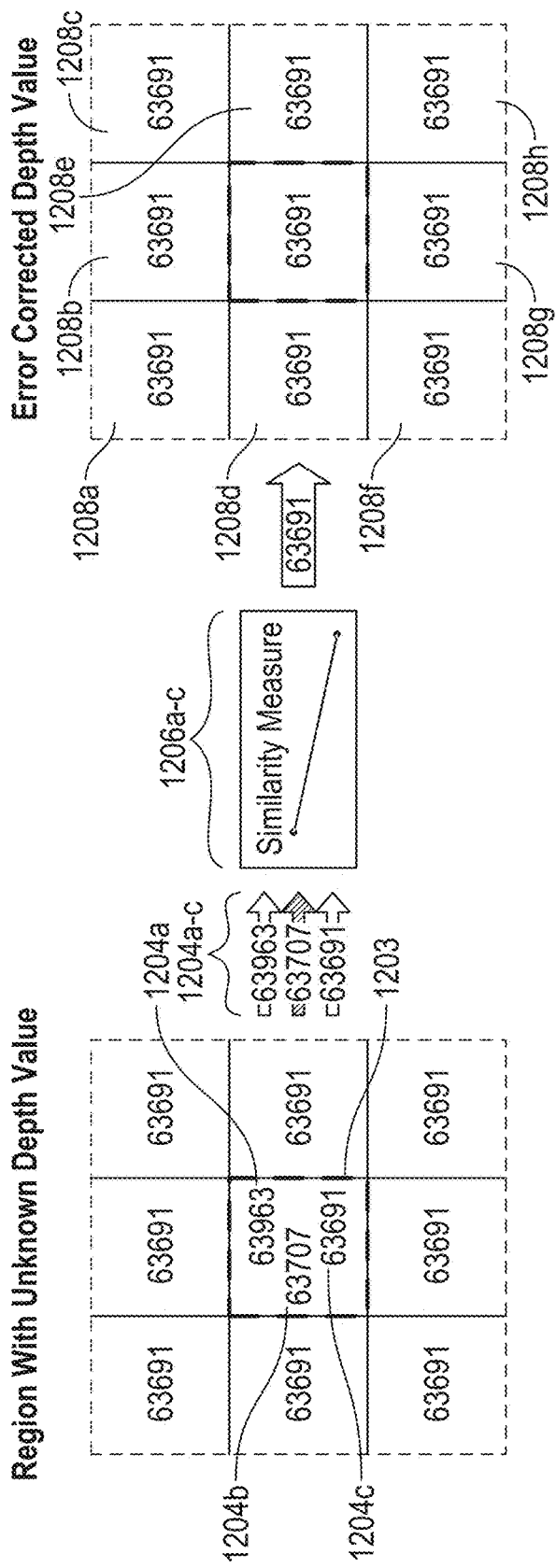
FIG. 12 illustrates an example of a process of error correction in a depth map.

FIG. 12 shows a portion of a process of error correction in a depth map, given a set of candidate replacement depths, such as 1110a-c illustrated in FIG. 11, which correspond to candidate depths 1204a-c respectively in FIG. 12. In some aspects, the discussion of FIG. 12 to follow describes one implementation of process 1180 of FIG. 11. FIG. 12 shows a 3×3 region with an unknown depth value at the center location 1203. The depth is unknown at location 1203 because the code received at location 1203 was not a valid code, as determined by detect error 1150 of FIG. 11. There are three validated candidate codewords 1204a-c that were validated by check validity 1170 of FIG. 11, and for which candidate depths were generated by generate depth step 1180. FIG. 12 illustrates that similarity measures 1206a-c are determined for the candidate depth determined for each corresponding candidate codeword 1204a-c with the depths of the other locations in the 3×3 neighborhood. FIG. 12 shows that based on the similarity measures for the three candidate codeword 1204a-c, codeword 1204c with value 63691 has a depth most similar to the depths of the eight neighboring locations 1208a-h. The error corrected depth value includes the selected depth.

In some aspects, a similarity measure 1206a-c is computed between each candidate replacement depth 1204a-c and neighboring depths. In some aspects, the neighboring depths may be limited to depths 1208a-h. In some aspects, a median of neighboring depths may be compared to each replacement depth 1110a-c, and the candidate depth that is most similar (for example, in some aspects, based on an absolute value of a difference between the median depth of the nearest neighbors) may be used to replace the invalid codeword 1102 of FIG. 11. Other embodiments may use measures other than median (for example, an average), and/or consider depths of fewer (for example, four) or more neighbors. In an embodiment, if all the similarity measures 1206a-c indicate a similarity below a similarity threshold, all candidate codewords may be rejected.

Figure 13:
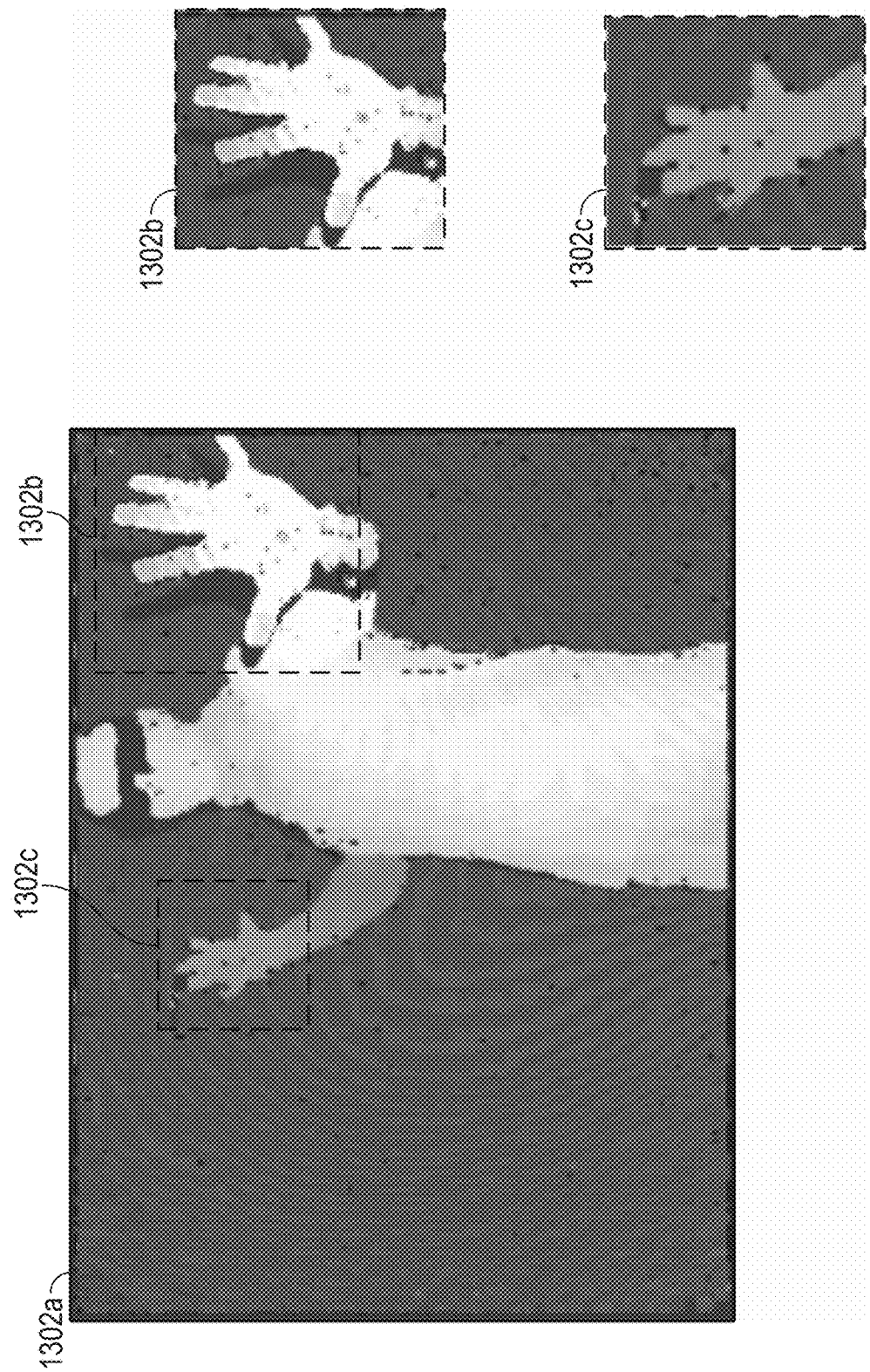
FIG. 13 depicts images illustrating some aspects of gap filling in a depth map using a median filter.

Known methods do not use the error detection and correction processes described above with respect to FIGS. 9, 11, and 12. For example, FIG. 13 shows gap filling in a depth map using a median filter. Median filter based solutions do not use knowledge of the underlying encoding of the structured light, and thus do not actually correct errors. Instead, errors are generally smoothed by the median filter into surrounding areas. The results of this smoothing are apparent in FIG. 13. The image 1302a includes the left hand 1302b and right hand 1302c. Both the left and right hands 1302b-c show a reduced number of gaps, but corresponding loss of detail.

Figure 14:
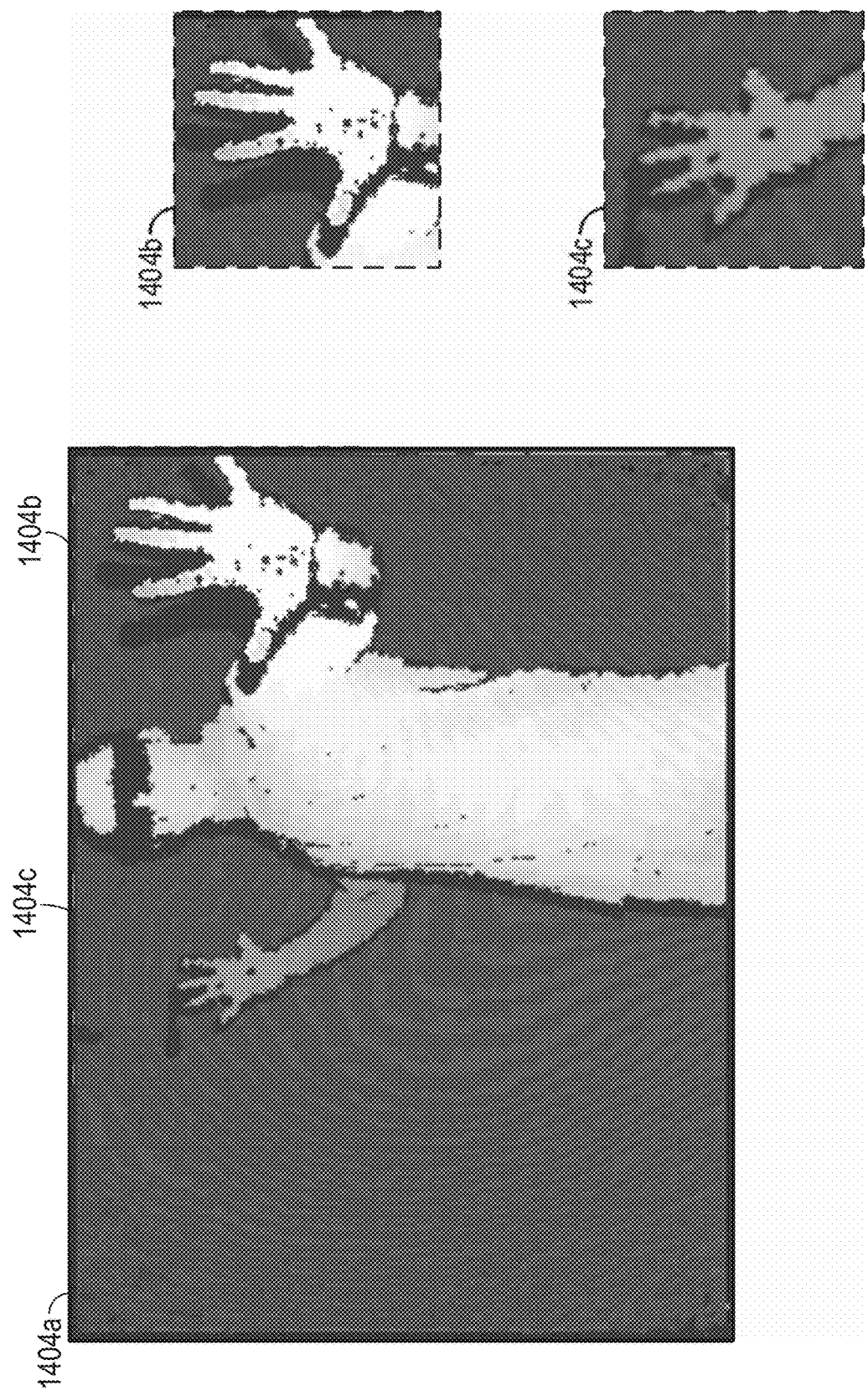
FIG. 14 depicts images illustrating some aspects of gap filling of a depth map using the methods and systems disclosed herein.

In contrast to the loss of detail shown by the median filter based solution of FIG. 13, FIG. 14 shows gap filling of a depth map using the methods and systems disclosed herein. As can be seen in the left and right hands 1404b-c of the image 1404a, while the gaps resulting from errors in the underlying coding have been reduced, detail is preserved relative to the left and right hands 1402b-c of the median filter shown in FIG. 13.

In an embodiment, to determine which candidate spatial code was most likely transmitted, each of the candidate spatial codes may be compared to neighboring spatial codes, and a candidate selected as the most likely transmitted code based on the comparison. For example, if the basis functions of the neighboring spatial codes are more consistent with one of the candidates than all the others, than that candidate may be selected. In an embodiment, the depth corresponding to each of the candidate spatial codes may be compared to neighboring estimated depths, and a candidate selected based on the comparison. For example, a median filter value of the neighboring depths may be compared to the depth corresponding to each candidate code, and the candidate code with the closest depth to the median filter value may be selected.

Figure 15:
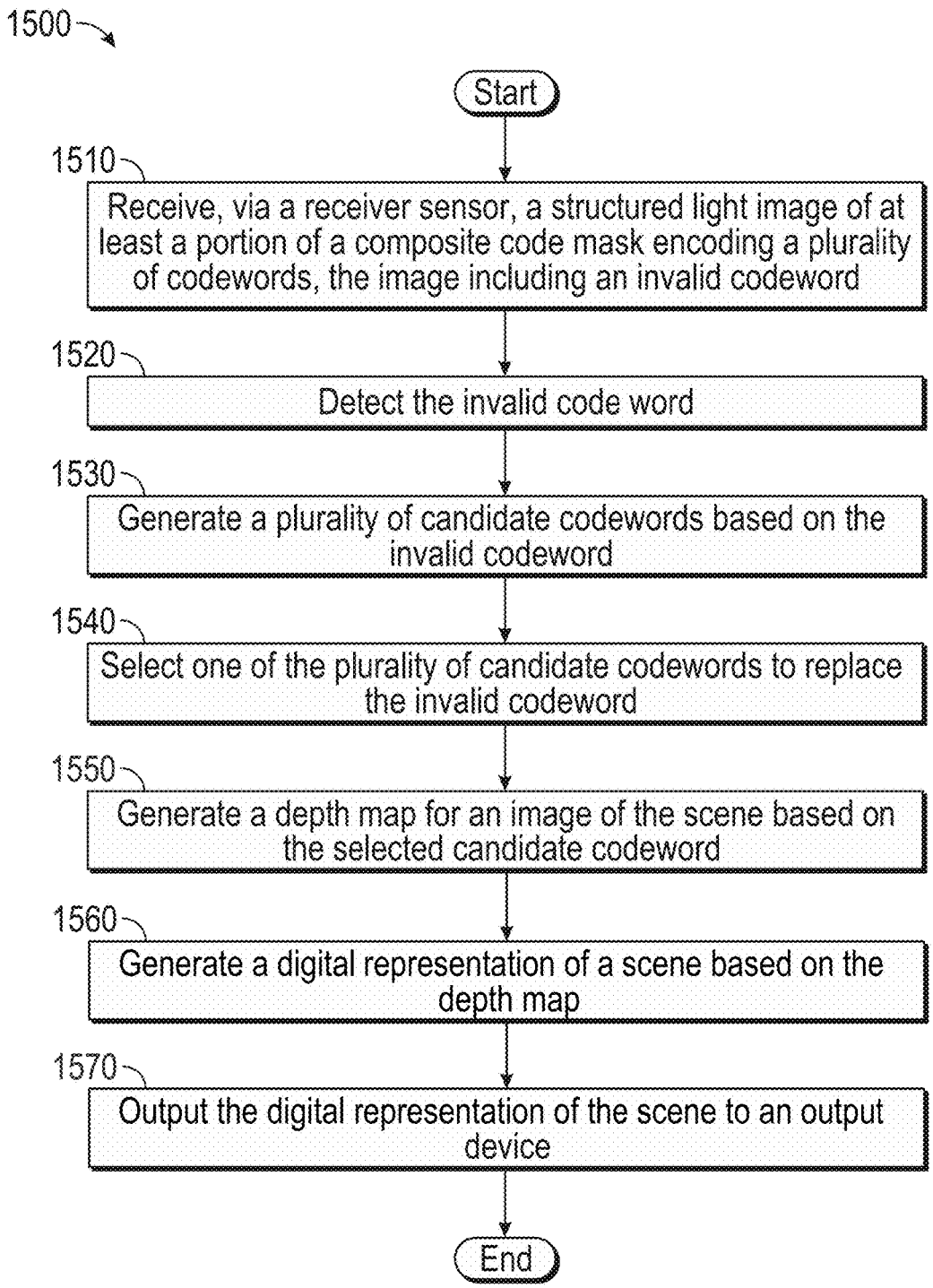
FIG. 15 is a flowchart that illustrates an example of a process of correcting errors in codewords generated from structured light.

FIG. 15 is a flowchart of a method of correcting errors in codewords generated from structured light. In some aspects, one or more of the features discussed above may also be associated with the implementation(s) described with respect to FIG. 15.

In some aspects, the method 1500 may be performed by the device 600, discussed above with respect to FIG. 6. For example, processor instructions stored in a memory 608 may configure the processor 606 to perform one or more of the functions discussed below with respect to method 1500. In some aspects, the method 1500 may be performed by the device 500, discussed above with respect to FIG. 5. For example, processor instructions stored in a memory/storage device 506 may configure the processing circuit 504 to perform one or more of the functions discussed below with respect to method 1500.

In block 1510, a receiver sensor receives a structured light image of at least a portion of a composite code mask encoding a plurality of codewords, the image including an invalid codeword. In some aspects, the block 1510 is performed by the light receiving element 604 discussed above with respect to FIG. 6. In some aspects, block 1510 is performed by the processor 606, which controls the light receiving element 604 to receive the composite code mask. In some aspects, the block 1510 is performed by the receiver sensor 508 discussed below with respect to FIG. 5. In some aspects, block 1510 is performed by the processing circuit 504, which controls the receiver sensor 508 to receive the composite code mask. In some aspects, the code mask portion may comprise one or more codewords. In some aspects, the codes have characteristics as described above with respect to "Exemplary Codes for Active Depth Sensing." For example, the codes may include characteristics such as code mask primitives (that may be tessellated), a codebook, a size and spatial resolution, codeword patterns, duty cycle, contour resolution or perfect window characteristics, symmetry (as described with reference to FIGS. 8A-8E), aliasing, and cardinality. In some aspects the encoded codewords may be organized into rows and or columns of data. In some aspects, the encoded codewords of the code mask are formed of combinations of a plurality of basis functions and rotated versions of the plurality of basis functions, for example, as discussed above with respect to FIG. 11.

In some aspects, valid codewords may sparsely populate the total possible values of a codeword. For example, in some aspects, a codeword may encode 32 bits of information, but have far fewer than $2^{31}$ valid values. Thus, in some aspects, codewords with invalid values may be determined to include one or more errors. In some aspects, less than 1% of the possible binary codewords are encoded in the code mask as valid codewords.

In block 1520, the method 1500 detects the invalid codeword. In some aspects, block 1520 may detect the invalid codeword using the error detection process 1150 as described above with reference to FIG. 11. In some aspects, block 1520 determines whether the received codeword is included in the plurality of encoded codewords (for example, in a code book), and if not, determines the received codeword is invalid. In some aspects, detecting the invalid codeword comprises comparing the received codeword to each of the plurality of basis functions and rotated versions of the plurality of basis functions, as described above with respect to FIG. 9. In some aspects, the comparing comprises match filtering the received codeword to each of the plurality of basis functions and rotated versions of the plurality of basis functions. In some aspects, the comparing comprises comparing the codeword to entries in a codebook. In some aspects, block 1520 is performed by the processor 606 or by the processing circuit 504.

Block 1530 generates a plurality of candidate codewords based on the invalid codeword. Block 1530 may generate codewords using candidate generation step 1160 and/or validity step 1170, described above with reference to FIG. 11, at least for codewords generated via the basis functions as described in FIG. 9. In some aspects, this may include generating one or more candidate codewords included in the code mask. In some cases a plurality of candidate codewords are generated for each of a plurality of codewords included in the portion of the code mask. As discussed above with respect to FIGS. 11 and 12, in some aspects, candidate codewords may be generated by perturbing individual bits in the codeword such that checking of the codeword indicates no error is present in the candidate portion. For example, if the codeword column includes eight bits, eight candidate masks may be generated, each candidate codeword perturbing one bit when compared to the corresponding codeword from the portion of the code mask received in block 1505. In some aspects, block 1530 is performed by the processor 606 or processing circuit 504.

In block 1540, one of the candidate codewords is selected. In some aspects, block 1540 may perform one or more of the functions discussed above with respect to the check validity step 1170 and/or the generate depths step 1180 discussed above.

In some aspects, selection of a candidate codeword may also include one or more of the functions discussed above with respect to FIG. 12. For example, in some aspects, a similarity measure between the depth associated with each candidate codeword and a depth value of a local neighborhood surrounding the invalid codeword may be generated. The candidate codeword most similar to the local neighborhood may be selected in block 1540.

In some aspects, the similarity corresponds to a difference in depth associated with each of the selected subset of candidate codewords and a depth associated with the local neighborhood of codewords around the invalid codeword.

In some aspects, the depth associated with the local neighborhood is a median depth. In some aspects, it is an average depth.

In some aspects, the local neighborhood of codewords around the invalid codeword consists of codewords within 1, 2, 3, 4, 5, 6, 7, 8, 9, 10 or 11 codeword locations of the location of the invalid codeword. In some aspects, the scope of a local neighborhood includes codewords positioned within a diagonal distance from the invalid codeword. For example, codewords within any one of 1, 2, 3, 4, 5, 6, 7, 8, 9, 10, 11 diagonal codeword positions may be included in the local neighborhood. In some aspects, block 1540 is performed by the processor 606 which selects a candidate codeword. In some aspects, block 1540 is performed by the processing circuit 504, which selects a candidate codeword.

In block 1550, a depth map based on the selected candidate codeword is determined. In some aspects, the selected candidate codeword may be included in the depth map at the position of the codeword that contained the error. In some aspects, the depth at the location of the selected codeword is determined based on the active depth sensing method as described above with reference to FIG. 3. The depth map may be used by one or more processing routines to process and improve an image of the scene. In some aspects, block 1550 is performed by the processor 606 which generates the depth map. In some aspects, block 1550 is performed by the processing circuit 504, which generates the depth map.

In block 1560 a digital representation of a scene is generated based on the depth map. In some aspects the digital representation of the scene is a three dimensional surface representation of the scene represented the depths of objects in the scene, based on depths in the depth map. In some aspects, the digital representation of the scene is a two dimensional representation of the scene using perspective and/or shadowing to represent three dimensional objects, using the depth information the depth map. In some aspects, the digital representations are used to generate computer graphic images of the scene. In some aspects, the digital representations are used to generate augmented reality images of the scene. In some aspects, the digital representations are used to generate solid representations of the scene, for example, for use in computer aided design, solid modelling, or for three dimensional printing. In some aspects, block 1560 is performed by the processor 606 or by the processing circuit 504.

In block 1570 the digital representation of the scene is outputted to an output device. In some aspects, the output device is a display, monitor, or projector. The display, monitor, or projector may be standalone, as in a television, or a component of a desktop computer, laptop, portable computer device, wearable computer, tablet computer, or phone, In some aspects, the output device generates three dimensional images, such as three dimensional displays or hologram projectors. In some aspects, the output device may be a printer of either pictures in two dimensions or objects in three dimensions, such as a 3D printer. In some aspects, the output device may be a solids or three dimensional modelling system, such as a computer aided engineering design system. In some aspects, block 1570 is performed by the processor 606 or by the processing circuit 504. In some aspects, blocks 1560 and 1570 may not be performed.

It should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements. In addition, terminology of the form "at least one of: A, B, or C" used in the description or the claims means "A or B or C or any combination of these elements."

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device (PLD), discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

In one or more aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Thus, in some aspects computer readable medium may comprise non-transitory computer readable medium (e.g., tangible media).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A method of generating a digital representation of a scene, the method comprising:

receiving at a sensor a structured light image of a plurality of encoded codewords, the plurality of encoded codewords including an invalid codeword;

detecting, using a processor, the invalid codeword by determining whether each encoded codeword in the structured light image corresponds to a code in a codebook stored in memory, the codebook comprising a list of valid codes;

generating, using the processor, candidate codewords based on the invalid codeword;

selecting, using the processor, one of the candidate codewords to replace the invalid codeword, wherein said selecting one of the candidate codewords comprises selecting from the generated candidate codewords a subset of candidate codewords, each candidate codeword in the subset being the same as one of the plurality of encoded codewords, determining a similarity between each candidate codeword in the subset and codewords within a local neighborhood around the invalid codeword; and selecting the candidate codeword in the subset most similar to the local neighborhood to replace the invalid codeword;

generating, using the processor, a depth map for an image of the scene based on the selected candidate codeword;

generating, using the processor, a digital representation of a scene based on the depth map; and outputting the digital representation of the scene to an output device.

2. The method of claim 1, wherein the encoded codewords in the structured light image are formed of combinations of a plurality of basis functions and rotated versions of the plurality of basis functions.

3. The method of claim 2, wherein detecting the invalid codeword comprises comparing each encoded codeword in the structured light image to each of the plurality of basis functions and rotated versions of the plurality of basis functions.

4. The method of claim 3, wherein the comparing comprises match filtering each encoded codeword in the structured light image to each of the plurality of basis functions and rotated versions of the plurality of basis functions.

5. The method of claim 1, wherein generating the plurality of candidate codewords comprises individually perturbing each element of the invalid codeword to generate a candidate codeword for each individual perturbation.

6. The method of claim 1, wherein generating the plurality of candidate codewords comprises iteratively perturbing at least two elements of the invalid codeword to generate a candidate codeword for each iteration until all combinations of at least two elements have been perturbed once.

7. The method of claim 1, wherein the similarity corresponds to a difference in depth associated with each of the selected subset of candidate codewords and a depth associated with the local neighborhood of codewords around the invalid codeword, and wherein the local neighborhood of codewords around the invalid codeword consists of codewords within 1, 2, 3, 4, 5, or 6 codeword locations of the location of the invalid codeword.

8. The method of claim 7, wherein the depth associated with the local neighborhood is a median depth.

9. An apparatus for generating a digital representation of a scene, comprising:

a receiver sensor configured to receive a structured light image of a plurality of encoded codewords, the plurality of encoded codewords including an invalid codeword; and a processing circuit in communication with the receiver sensor, the processing circuit configured to detect the invalid codeword by determining whether each encoded codeword in the structured light image corresponds to a code in a codebook stored in memory, the codebook comprising a list of valid codes, generate candidate codewords based on the invalid codeword, select one of the candidate codewords to replace the invalid codeword, wherein said select one of the candidate codewords comprises:

selecting a subset of candidate codewords, each candidate codeword in the subset being the same as one of the plurality of encoded codewords, determining a similarity between each candidate codeword in the subset and codewords within a local neighborhood around the invalid codeword, and selecting the candidate codeword in the subset most similar to the local neighborhood to replace the invalid codeword, generate a depth map for an image of the scene based on the selected candidate codeword, generate a digital representation of a scene based on the depth map, and output the digital representation of the scene to an output device.

10. The apparatus of claim 9, wherein the encoded codewords in the structured light image are formed of combinations of a plurality of basis functions and rotated versions of the plurality of basis functions.

11. The apparatus of claim 10, wherein the processing circuit is further configured to compare each encoded codeword in the structured light image to each of the plurality of basis functions and rotated versions of the plurality of basis functions.

12. The apparatus of claim 10, wherein the processing circuit is further configured to match filter each encoded codeword in the structured light image to each of the plurality of basis functions and rotated versions of the plurality of basis functions.

13. The apparatus of claim 9, wherein the processing circuit is further configured to perturb each element of the invalid codeword and generate a candidate codeword for each individual perturbation.

14. The apparatus of claim 13, wherein the processing circuit is further configured to iteratively perturb at least two elements of the invalid codeword to generate a candidate codeword for each iteration until all combinations of at least two elements have been perturbed once.

15. The apparatus of claim 9, wherein the similarity corresponds to a difference in depth associated with each of the selected subset of candidate codewords and a depth associated with the local neighborhood of codewords around the invalid codeword, and wherein the local neighborhood of codewords around the invalid codeword consists of codewords within 1, 2, 3, 4, 5, or 6 codeword locations around the codeword location of the invalid codeword.

16. The apparatus of claim 15, wherein the depth associated with the local neighborhood is a median depth.

17. An apparatus for generating a digital representation of a scene, comprising:

means for receiving a structured light image of a plurality of encoded codewords, the plurality of encoded codewords including an invalid codeword;

means for detecting the invalid codeword comprising means for determining whether each encoded codeword in the structured light image corresponds to a code in a codebook, the codebook comprising a list of valid codes;

means for generating candidate codewords based on the invalid codeword;

means for selecting one of the candidate codewords to replace the invalid codeword, wherein said means for selecting one of the candidate codewords to replace the invalid codeword comprises means for selecting from the generated candidate codewords a subset of candidate codewords, each candidate codeword in the subset being the same as one of the plurality of encoded codewords, means for determining a similarity between each candidate codeword in the subset and codewords within a local neighborhood around the invalid codeword, and means for selecting the candidate codeword in the subset most similar to the local neighborhood to replace the invalid codeword;

means for generating a depth map for an image of the scene based on the selected candidate codeword;

means for generating a digital representation of a scene based on the depth map; and means for outputting the digital representation of the scene to an output device.

18. The apparatus of claim 17, wherein the receiving means comprises a receiver sensor, wherein the detecting invalid codeword means comprises a processing circuit, wherein the generating candidate codeword means comprises the processing circuit, wherein the selecting codeword means comprises the processing circuit, wherein the generating depth map means comprises the processing circuit, wherein the generating digital representation means comprises the processing circuit, and wherein the outputting means comprises the processing circuit.

19. The apparatus of claim 17, wherein the encoded codewords in the structured light image are formed of combinations of a plurality of basis functions and rotated versions of the plurality of basis functions, wherein the detecting invalid codeword means comprises means for comparing each encoded codeword to each of the plurality of basis functions and rotated versions of the plurality of basis functions, and wherein the comparing means comprises means for match filtering each encoded codeword to each of the plurality of basis functions and rotated versions of the plurality of basis functions.

20. The apparatus of claim 17, wherein the generating means comprises individually perturbing each element of the invalid codeword to generate a candidate codeword for each individual perturbation, and wherein the generating means comprises iteratively perturbing at least two elements of the invalid codeword to generate a candidate codeword for each iteration until all combinations of at least two elements have been perturbed once.

21. The apparatus of claim 17, wherein the similarity corresponds to a difference in depth associated with each of the selected subset of candidate codewords and a depth associated with the local neighborhood of codewords around the invalid codeword, wherein the depth associated with the local neighborhood is a median depth and wherein the local neighborhood of codewords around the invalid codeword consists of codewords within 1, 2, 3, 4, 5, or 6 codeword locations around the location of the invalid codeword.

22. A non-transitory computer-readable medium storing instructions for generating a digital representation of a scene, the instructions that, when executed, perform a method comprising:

receiving, via a receiver sensor, a structured light image of a plurality of encoded codewords, the plurality of encoded codewords including an invalid codeword;

detecting the invalid codeword, wherein detecting the invalid codeword comprises determining whether each encoded codeword in the structured light image corresponds to a code in a codebook, the codebook comprising a list of valid codes;

generating candidate codewords based on the invalid codeword;

selecting one of the candidate codewords to replace the invalid codeword, wherein said selecting one of the candidate codewords to replace the invalid codeword comprises
    selecting a subset of candidate codewords, each candidate codeword in the subset being the same as one of the encoded codewords,
    determining a similarity between each candidate codeword in the subset and codewords within a local neighborhood around the invalid codeword, and
    selecting the candidate codeword most similar to the local neighborhood to replace the invalid codeword;
generating a depth map for an image of the scene based on the selected candidate codeword;
generating a digital representation of a scene based on the depth map; and
outputting the digital representation of the scene to an output device.

23. The method of claim 22, wherein generating the plurality of candidate codewords comprises changing, one at a time, each bit of the invalid codeword and generating a candidate codeword for each change of a bit.

\* \* \* \* \*

UNITED STATES PATENT AND TRADEMARK OFFICE
CERTIFICATE OF CORRECTION

| | | |
|---|---|---|
| PATENT NO. | : 9,948,920 B2 | Page 1 of 1 |
| APPLICATION NO. | : 14/820419 | |
| DATED | : April 17, 2018 | |
| INVENTOR(S) | : James Wilson Nash | |

It is certified that error appears in the above-identified patent and that said Letters Patent is hereby corrected as shown below:

On the Title Page

In Item (56), Page 2 at Column 2, Line 53, Under Other Publications, change "ISNN:" to --ISSN:--.

In the Specification

In Column 14, Line 3-8 (approx.), Change " $932\begin{bmatrix}0\\1\\1\\1\end{bmatrix}$ " to -- $932\begin{bmatrix}0\\1\\0\\1\end{bmatrix}$ --.

In Column 20, Line 14 (approx.), Change "and or" to --and/or--.

In Column 21, Line 67, Change "phone," to --phone.--.

Signed and Sealed this
Thirteenth Day of November, 2018

Andrei Iancu
*Director of the United States Patent and Trademark Office*